US012713957B2

(12) United States Patent
Chen et al.

(10) Patent No.: US 12,713,957 B2
(45) Date of Patent: Aug. 18, 2026

(54) BONDING SCHEME FOR SEMICONDUCTOR PACKAGING

(71) Applicant: Taiwan Semiconductor Manufacturing Co., Ltd., Hsinchu (TW)

(72) Inventors: Wei-Yu Chen, Taipei City (TW); Chao-Wei Chiu, Hsinchu (TW); Hsin Liang Chen, New Taipei City (TW); Hao-Jan Shih, Hsinchu (TW); Hao-Jan Pei, Hsinchu (TW); Hsiu-Jen Lin, Zhubei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 306 days.

(21) Appl. No.: 18/585,599

(22) Filed: Feb. 23, 2024

(65) Prior Publication Data

US 2025/0149488 A1 May 8, 2025

Related U.S. Application Data

(60) Provisional application No. 63/596,099, filed on Nov. 3, 2023.

(51) Int. Cl.

*H10W 72/20* (2026.01)
*H10P 54/00* (2026.01)

(Continued)

(52) U.S. Cl.

CPC ....... *H10W 72/20* (2026.01); *H10W 72/0198* (2026.01); *H10W 72/072* (2026.01); *H10W 72/90* (2026.01); *H10W 72/923* (2026.01); *H10P 54/00* (2026.01); *H10W 72/01953* (2026.01); *H10W 72/07202* (2026.01);

(Continued)

(58) Field of Classification Search

CPC ............ H10W 72/012; H10W 72/923; H10W 72/2528; H10W 72/29; H10W 72/252; H10W 72/072; H10W 20/0698; H10W 70/65

See application file for complete search history.

(56) References Cited

U.S. PATENT DOCUMENTS 6,083,829 A * 7/2000 Lai ...................... H10W 20/043 257/E21.175
6,465,294 B1 * 10/2002 Tsai .................... H10W 20/086 257/E21.507

(Continued)

FOREIGN PATENT DOCUMENTS

TW 201806091 A 2/2018

*Primary Examiner* — Mohsen Ahmadi
(74) *Attorney, Agent, or Firm* — Slater Matsil, LLP

(57) ABSTRACT

In an embodiment, a method includes forming a device region along a first substrate; forming an interconnect structure over the device region and the first substrate; forming a metal pillar over the interconnect structure, forming the metal pillar comprising: forming a base layer over the interconnect structure; forming an intermediate layer over the base layer; and forming a capping layer over the intermediate layer; forming a solder region over the capping layer; and performing an etch process to recess sidewalls of the base layer and the capping layer from sidewalls of the intermediate layer and the solder region.

20 Claims, 31 Drawing Sheets

(51) Int. Cl.

| | |
|---|---|
| ***H10W 72/00*** | (2026.01) |
| ***H10W 72/29*** | (2026.01) |
| ***H10W 72/90*** | (2026.01) |
| *H10W 95/00* | (2026.01) |

(52) U.S. Cl.

CPC .... *H10W 72/07255* (2026.01); *H10W 72/221* (2026.01); *H10W 72/241* (2026.01); *H10W 72/252* (2026.01); *H10W 72/2528* (2026.01); *H10W 72/29* (2026.01); *H10W 72/934* (2026.01); *H10W 72/952* (2026.01); *H10W 95/00* (2026.01)

(56) References Cited

U.S. PATENT DOCUMENTS

| | | | | |
|---|---|---|---|---|
| 6,495,452 | B1 * | 12/2002 | Shih | H10W 20/037<br>257/E21.314 |
| 6,709,965 | B1 * | 3/2004 | Chen | H10W 20/082<br>438/739 |
| 9,831,215 | B1 | 11/2017 | Chen et al. | |
| 2012/0012997 | A1 * | 1/2012 | Shen | H10W 90/701<br>257/E21.507 |
| 2018/0358315 | A1 * | 12/2018 | Kuan | H10W 70/611 |
| 2020/0052107 | A1 * | 2/2020 | Lie | H10D 30/62 |
| 2021/0035938 | A1 * | 2/2021 | Chang | H10W 72/072 |
| 2023/0278856 | A1 * | 9/2023 | Liu | B81B 7/0006<br>257/254 |
| 2023/0378190 | A1 * | 11/2023 | Liaw | H10D 30/6757 |
| 2024/0072047 | A1 * | 2/2024 | Xie | H10D 30/6735 |
| 2025/0040442 | A1 * | 1/2025 | Chang | H01F 41/14 |

* cited by examiner 100
105
105
105
105
F2
115
122
120
110

124A
124B
124C
124D
328
125
225
224D
224C
224B
224A
110
132
136
210
330

328

128
228
T1
T2
T3
T4
T5
T6
T7
T8
130
230

110
132
136
210
124A
124B
124C-1
124C-2
124D
125
328
225
224D
224C-1/224C-2
224B
224A
330

128
228
T1
T2
T3
T4
T5
T6
T7
T8
130
230

110
132
136
210
330
124A
124B
124C
124D
125
328
225
224B/224D
224A 128
228
T1
T2
T3
T4
T8
T5+T6+T7
130
230

124A
124B
124C
124D
128
136
132
110
T1
T2
T3
T4
130
230
228
224D
224C
224B
224A
T8
T7
T6
T5
210

BONDING SCHEME FOR SEMICONDUCTOR PACKAGING

PRIORITY CLAIM AND CROSS-REFERENCE

This application claims the benefit of U.S. Provisional Application No. 63/596,099, filed on Nov. 3, 2023, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
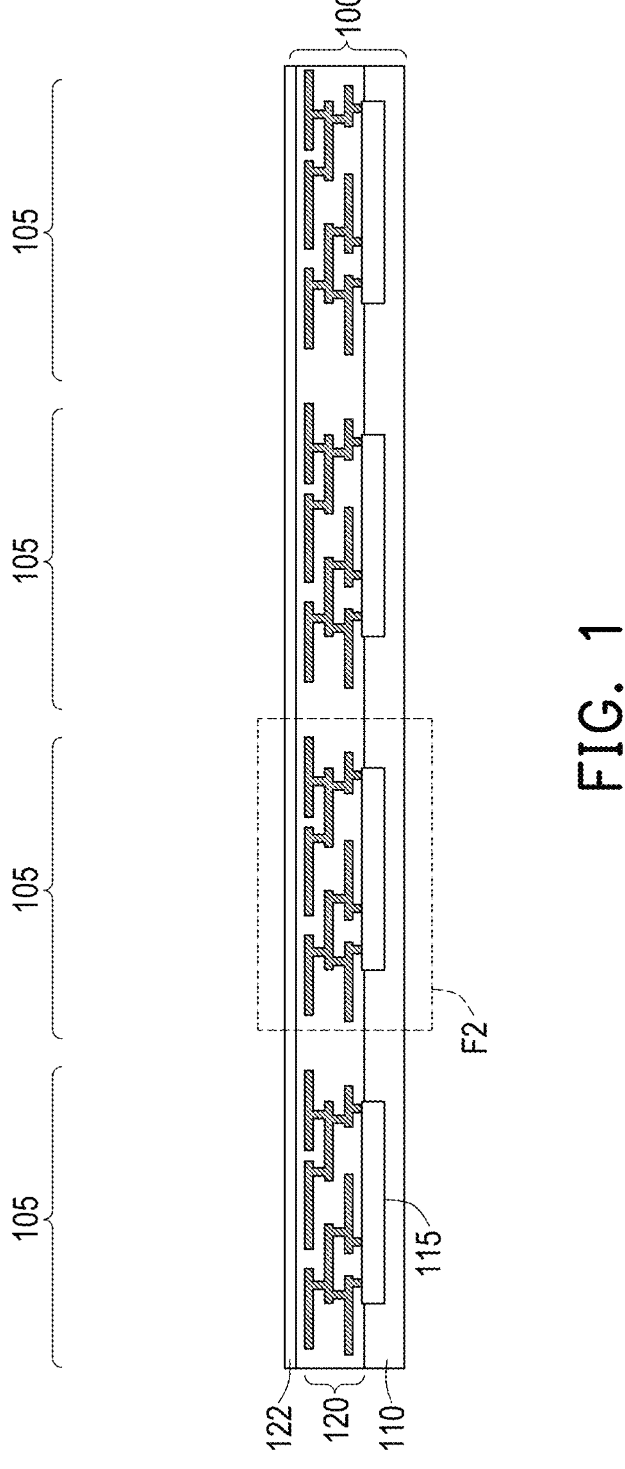
FIGS. 1-10 illustrate intermediate stages in the formation of a package component, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In system-on-integrated-circuit (SoIC) devices, integrated circuit devices (which may also be referred to as dies or chips) are attached together into a single system device package. Such SoIC devices be formed by bonding, for example, a die to a wafer in a chip-on-wafer (CoW) bonding process and then later singulating the wafer to form an SoIC device. One way of performing such a bonding is by forming solder connectors (e.g., solder regions) that extend between two metal connectors (e.g., metal pillars)—one on the die and one on the wafer. The solder regions and the metal pillars may collectively be referred to as connector structures. As the connector structures and pitches there-between get smaller in size to achieve greater connection density to match device density, there is a greater risk of connector failure. One common failure, for example, is formation of voids (e.g., Kirkendall voids) in and around merged solder regions. When the solder regions are reflowed to bond the two connector structures together, the merged solder region may squeeze upward and downward along the metal pillars which creates a larger region through which elements (e.g., copper, tin, etc.) may diffuse, causing voids thereby potentially leading to device failure, unreliability, or disconnection. In addition to the bonding process, this phenomena may be caused by functional use and/or storage of the semiconductor devices. Moreover, certain types of stress testing of the semiconductor devices may mimic these conditions at a faster rate to sufficiently reproduce the phenomena.

Embodiments disclosed herein improve bonding of package components in the fabrication of semiconductor devices such as semiconductor packages. In particular, the metal pillars of the connector structures are designed to include intermediate layers which reduce the spreading of the merged solder regions upward and downward along the metal pillars. After bonding the package components and performing subsequent processing, the semiconductor devices may undergo the above-described stress testing to show that voids are prevented in and around the bonded connector structures.

FIG. 1 is a cross-sectional view of a wafer 100 having die regions 105 defined within. In a subsequent process, the die regions 105 may be singulated into multiple integrated circuit dies. The types of dies formed in each of the die regions 105 are not limited. For example, the die regions 105 may be singulated into a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The formation of the integrated circuit dies in each of the die regions 105 may be done according to applicable manufacturing processes to form integrated circuits. For example, the die formed in the die region 105 includes a semiconductor substrate 110, such as silicon, doped or undoped, or an active layer of a semiconductor-on-insulator (SOI) substrate. The semiconductor substrate 110 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 110 has an active surface (e.g., the surface facing upwards in FIG. 1), sometimes called a front side, and an inactive surface (e.g., the surface facing downwards in FIG. 1), sometimes called a back side.

Devices are disposed at the active surface of the semiconductor substrate 110 in a device region 115. The device region 115 may include active devices (e.g., transistors, diodes, etc.), capacitors, resistors, etc. For example, the device region 115 may include transistors that include gate structures and source/drain regions, where the gate structures are on channel regions, and the source/drain regions are adjacent the channel regions.

An interconnect 120 is disposed over the active surface of the semiconductor substrate 110. The interconnect structure 120 includes one or more dielectric layers, such as an inter-layer dielectric (ILD) or inter-metal dielectric (IMD), with one or more metallization patterns disposed therein. Conductive vias can be used to connect the device region 115 to the metallization patterns and connect metallization patterns to one another. The dielectric layers may be formed of materials such as Phospho-Silicate Glass (PSG), Boro-Silicate Glass (BSG), Boron-Doped Phospho-Silicate Glass (BPSG), undoped Silicate Glass (USG), or the like, which may be formed by a deposition process such as chemical vapor deposition (CVD), atomic layer deposition (ALD), or the like. Conductive vias can extend through the dielectric layers to electrically and physically couple contacts of the devices in the device region 115. In some embodiments, the dielectric layers may be low-k dielectric layers. The metallization patterns and vias may be formed in the dielectric layers 64 by a damascene process, such as a single damascene process, a dual damascene process, or the like. The metallization patterns and conductive vias may be formed of a suitable conductive material, such as copper, tungsten, aluminum, silver, gold, a combination thereof, or the like.

A passivation layer 122 is disposed on the interconnect structure 120. The passivation layer 122 may comprise one or more layers and be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzocyclobutene (BCB) based polymer, molding compound, the like, or a combination thereof. The passivation layers 122 may be formed by chemical vapor deposition (CVD), spin coating, lamination, the like, or a combination thereof. In some embodiments, the passivation layer 122 includes a silicon oxynitride layer or a silicon nitride layer.

FIGS. 2 through 9 are magnified views of the dashed box F2 in FIG. 1 and illustrate processes of forming connectors on the die regions 105, in accordance with embodiments.

Figure 2:
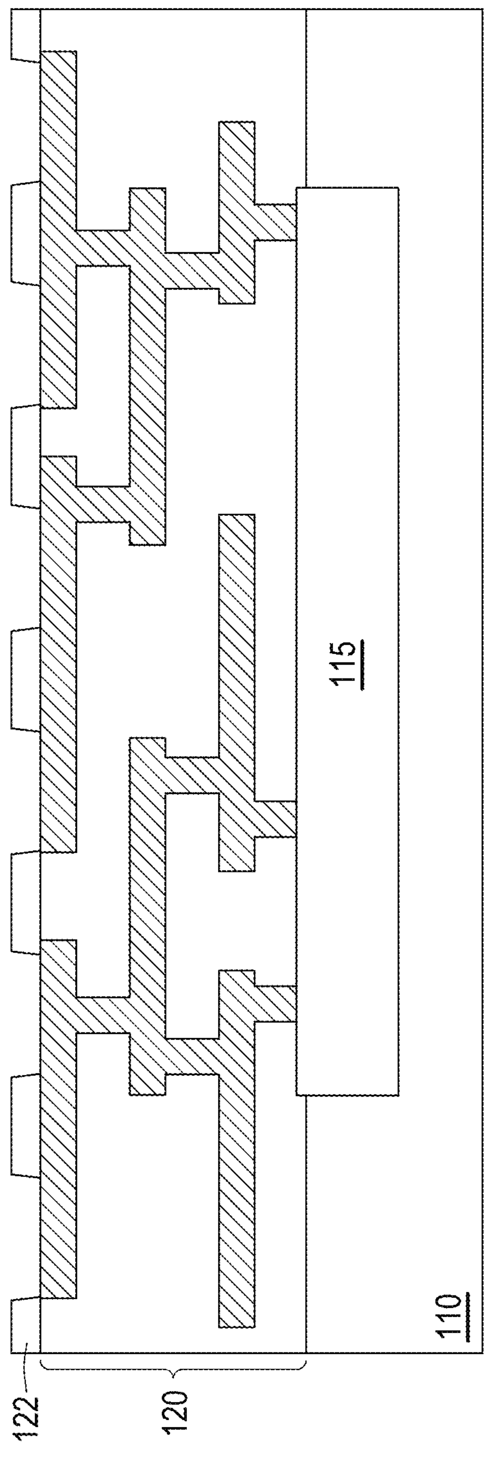

In FIG. 2, openings are formed in the passivation layer 122. The passivation layer 122 may be patterned using acceptable photolithography and etching techniques to form the openings, the openings exposing conductive elements electrically coupled to the interconnect 120. For example, a photomask may be formed over the passivation layer 122 by spin coat or another deposition, exposed to a light pattern, and developed to form a pattern therein. The passivation layer 122 may be patterned by transferring the photomask pattern to the passivation layer 122 by an etching technique to form the openings. Then, the photomask may be removed using any acceptable technique, such as an ashing technique.

In FIGS. 3A-3D, metal pillars 124 (e.g., under bump metallurgies (UBMs)) are formed in the openings of the passivation layer 122. In accordance with some embodiments of the present disclosure, the metal pillars 124 are formed to be in contact with a metallization of the interconnect structure 120. In accordance with some embodiments (not specifically illustrated), additional conductive lines and dielectric layers may be formed over the interconnect structure 120 underlying the metal pillars 124. For example, there may be metal pads formed over the interconnect structure 120 and the metal pillars 124 may be formed over the metal pads.

Figure 3A:
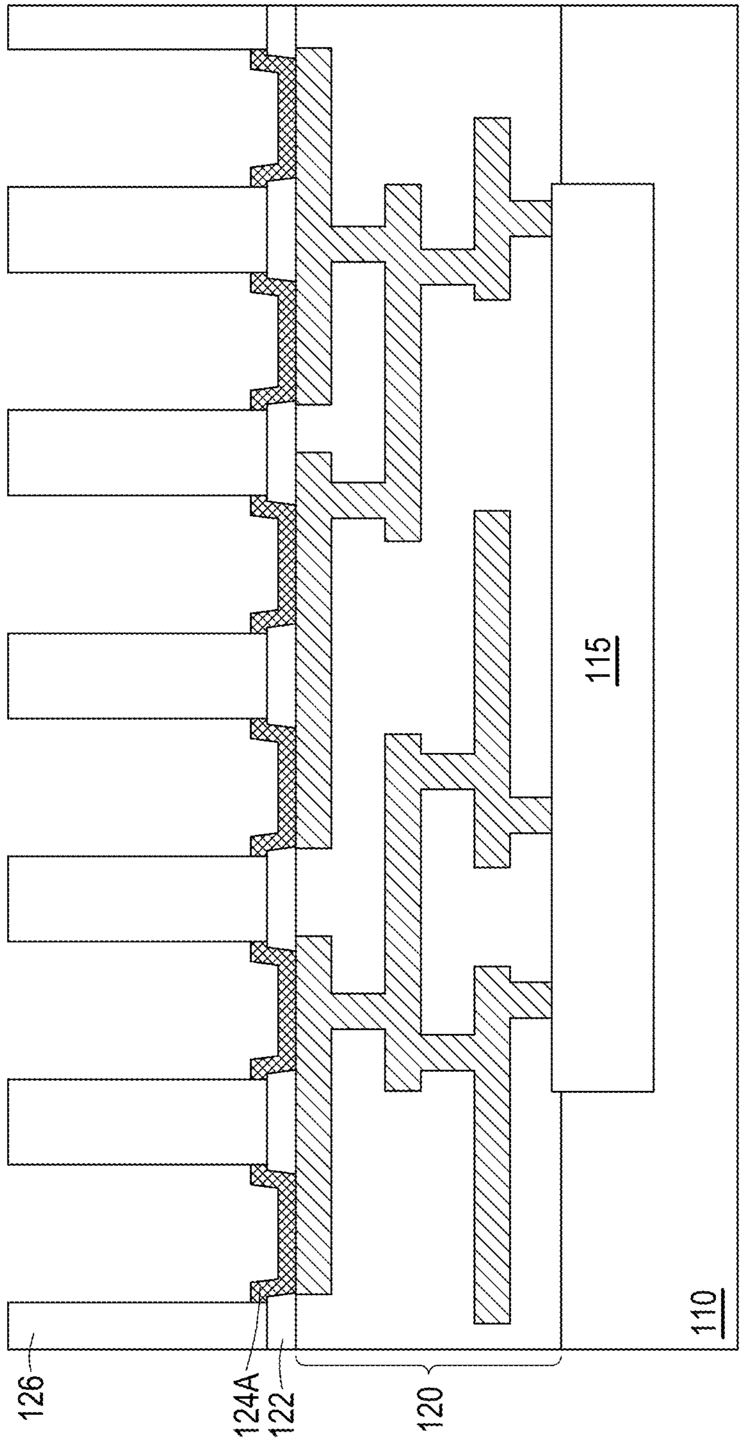

Referring to FIG. 3A, as an example of forming the metal pillars 124, a seed layer 124A may be deposited over the passivation layer 122. The seed layer 124A may include a multi-layer structure (not separately illustrated) and may include a first layer of a titanium layer, a titanium nitride layer, a tantalum layer, a tantalum nitride layer, or the like, and a second upper layer of copper or a copper alloy. The seed layer 124A may be a single layer, which may be a copper layer, for example. The seed layer 124A may be formed using Physical Vapor Deposition (PVD), Plasma Enhanced CVD (PECVD), atomic layer deposition (ALD), etc., although other applicable methods may also be used. The seed layer 124A is a conformal layer that extends into openings of the passivation layer 122 and contacts the metal feature exposed by the openings.

A plating mask 126 is then formed over the seed layer 124A and patterned to form openings corresponding to the metal pillars 124. The plating mask 126 may be formed of a photoresist by spin on and patterned using acceptable photolithography techniques. The openings in the plating mask 126 expose portions of the seed layer 124A in the openings of the passivation layer 122. The patterning of plating mask 126 may include a light-exposure process and a development process.

In accordance with various embodiments, multiple plating processes are performed to form pillar portions of the metal pillars 124 over the seed layer 124A. The pillar portions include a plurality of non-solder metal layers. For example, the pillar portions may include a base layer 124B, one or more intermediate layers 124C, and a capping layer 124D. The base layer 124B may be a copper-containing layer, such as copper or a copper alloy. The intermediate layer(s) 124C may include a nickel-containing layer, an iron-cobalt layer, a palladium-containing layer, a gold layer, the like, and/or a combination thereof. The capping layer 124D may be a copper-containing layer, such as copper or a copper alloy. In some embodiments (not specifically illustrated), the capping layer 124D may further include a topmost protective layer which may include nickel, palladium, gold, and/or the like.

Figure 3B:
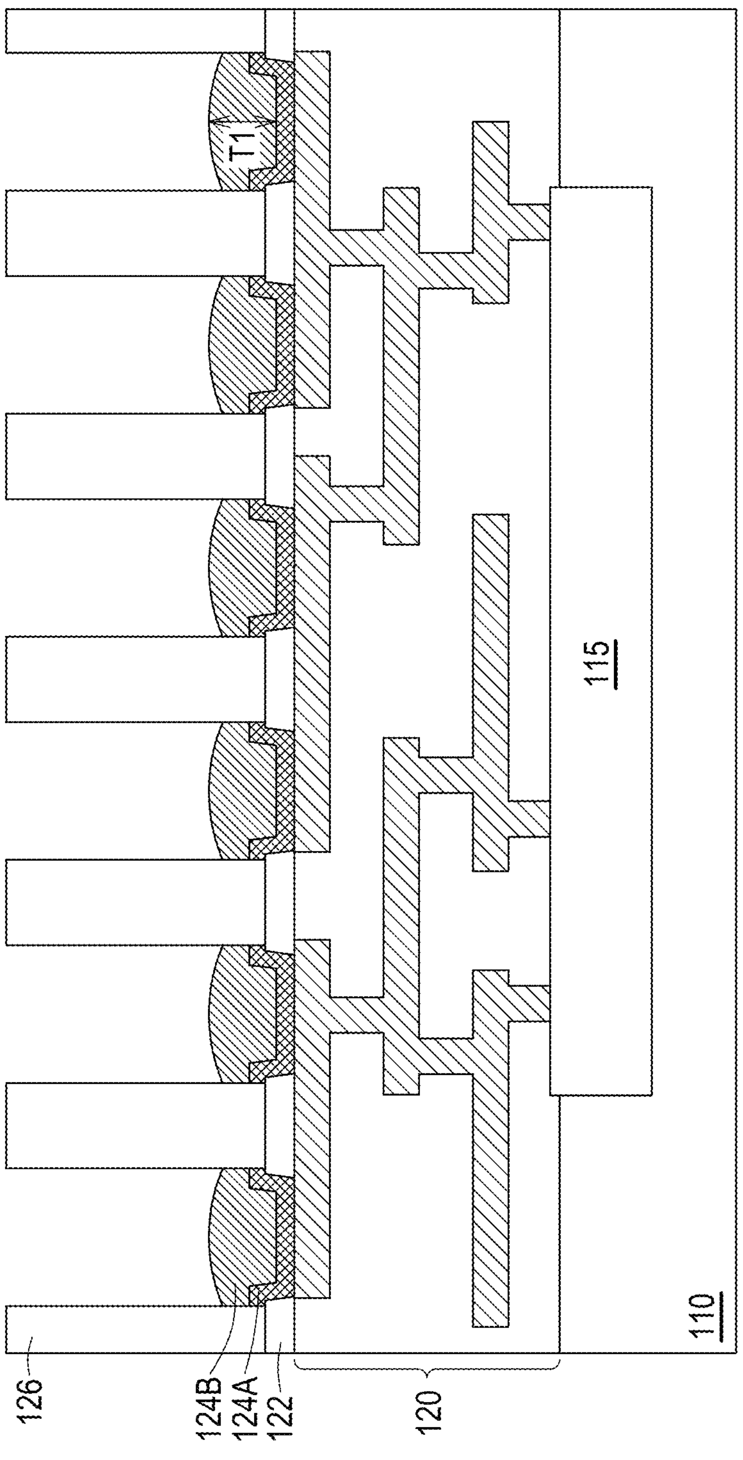

Referring to FIG. 3B, the base layer 124B is a copper-containing (e.g., substantially copper) layer and formed by electro plating, electroless plating, or any suitable method. The base layer 124B may be formed over the exposed surfaces of the seed layer 124A in the openings in the plating mask 126. For example, the base layer 124B may be formed to a thickness T1 ranging from 1 μm to 2 μm.

Figure 3C:
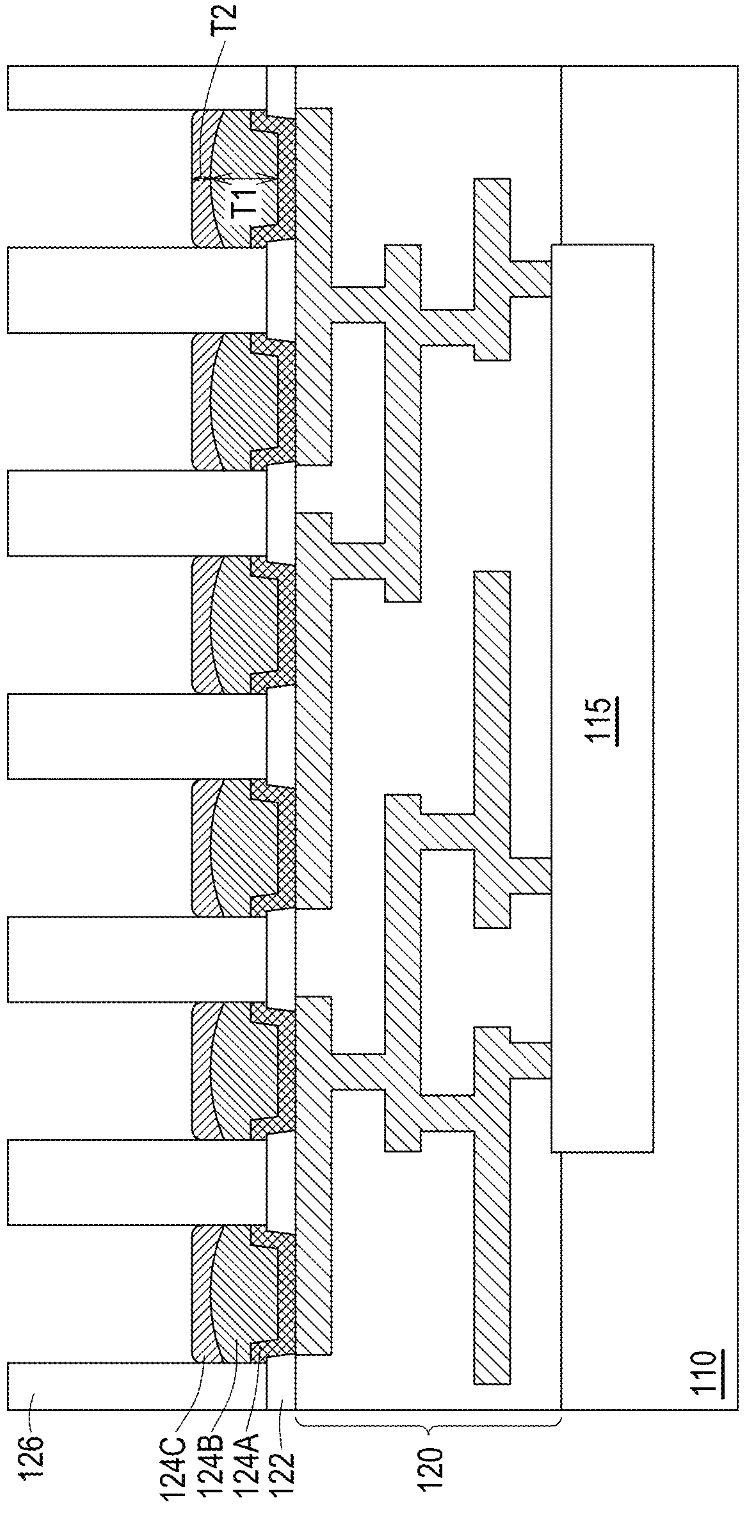

Referring to FIG. 3C, the intermediate layer(s) 124C may then be formed over the base layer 124B by electro plating, electroless plating, or any suitable method. The intermediate layer 124C may be a single layer or a multi-layer (e.g., a bi-layer) comprising nickel, iron, cobalt, or combinations thereof. In some embodiments, the intermediate layer 124C may be a single nickel-containing layer. For example, the intermediate layer 124C may be formed to a thickness T2 ranging from 1 μm to 2 μm. In other embodiments, the intermediate layer 124C may be a bi-layer including the materials described above, such as being a nickel-containing layer and an iron-cobalt-containing layer (see FIGS. 14A-14C). In such embodiments, the bi-layer intermediate layer 124C may also be formed to a total thickness T2 ranging from 1 μm to 2 μm (e.g., 0.5 μm to 1 μm for each layer).

Figure 3D:
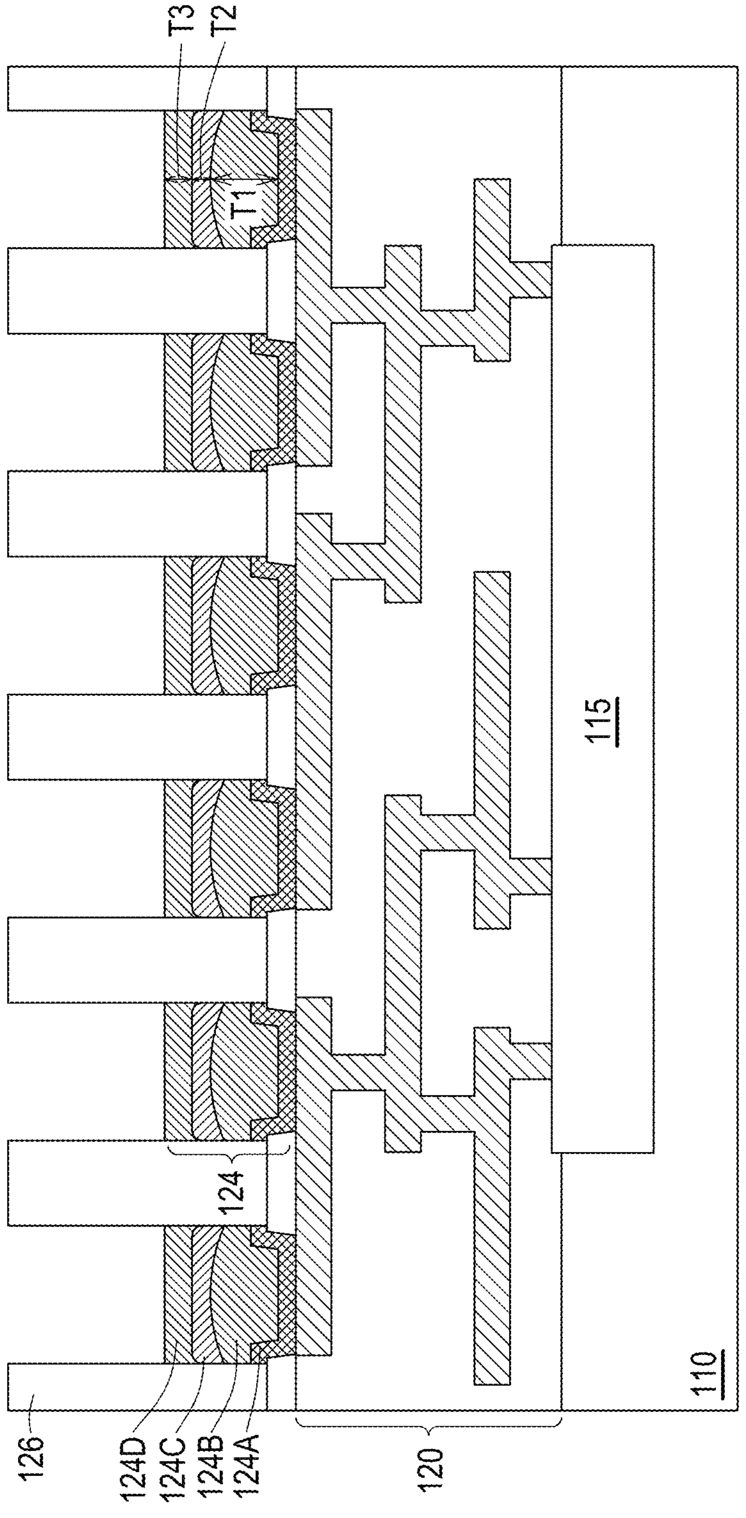

Referring to FIG. 3D, the capping layer 124D may be formed over the intermediate layer(s) 124C by electro plating, electroless plating, or any suitable method. In some embodiments, the capping layer 124D is another copper-containing (e.g., substantially copper) layer. For example, the capping layer 124D may be formed to a thickness T3 ranging from 1 μm to 2 μm.

Note that the seed layer 124A, the base layer 124B, the intermediate layer(s), and the capping layer 124D may be collectively referred to as the "metal pillar" or the "UBM" (e.g., components of the metal pillar 124). In addition, the base layer 124B, the intermediate layer(s), and the capping layer 124D may be collectively referred to as the "pillar" or "metal pillar" of the UBM. However, the seed layer 124A alone may be referred to as the "UBM" while the other layers (e.g., the base layer 124B, the intermediate layer(s) 124C, and the capping layer 124D) are referred to as the "pillar" or "metal pillar."

Figure 4:
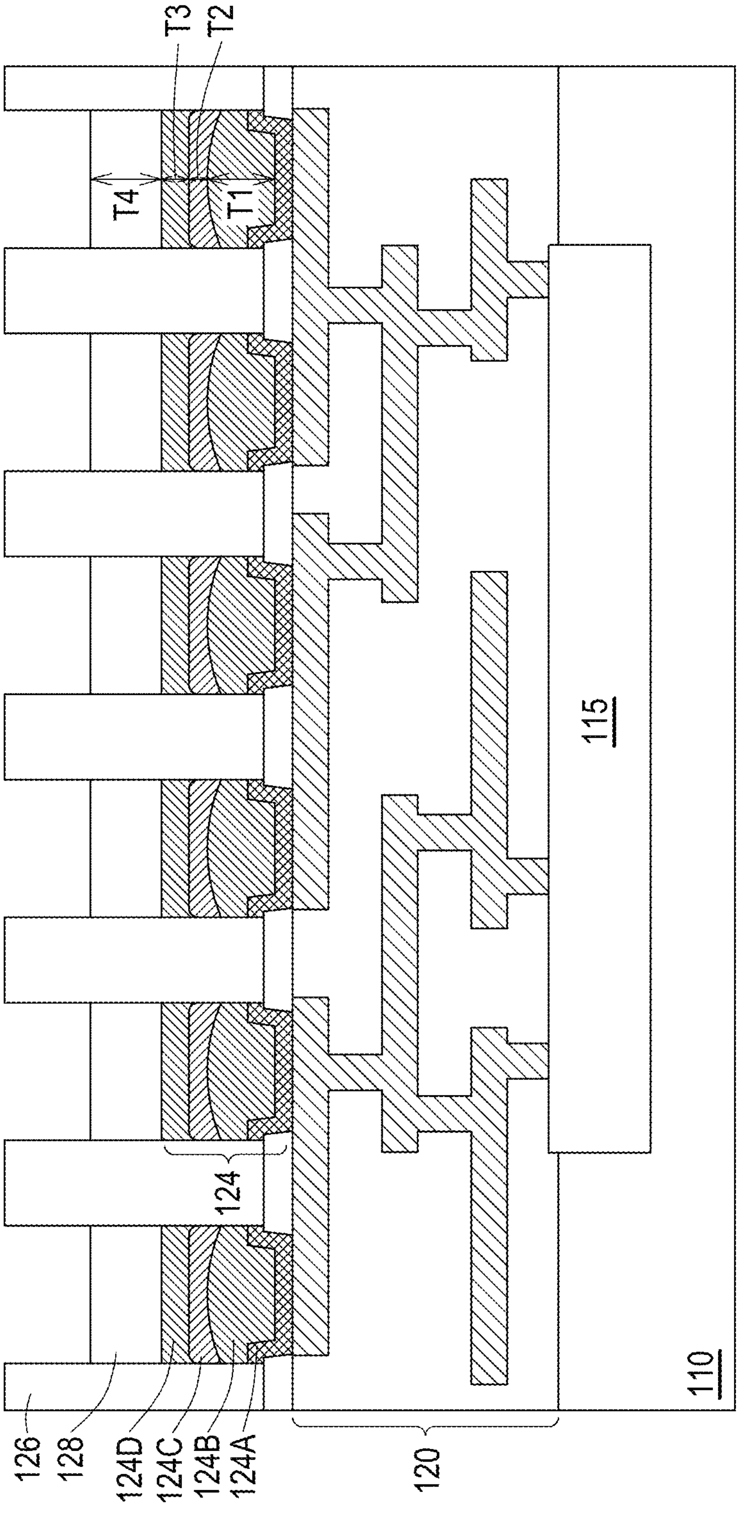

In FIG. 4, the plating mask 126 is left in place for the formation of the solder regions 128 on top of the metal pillars 124, which may be formed by a plating process (e.g., electro plating, electroless plating, or the like). Solder regions 128 may be formed of a eutectic material, such as a Sn—Ag—In alloy, a Cu—Sn alloy (e.g., $Cu_3Sn$, $Cu_6Sn_5$, or the like), Sn—Ag alloy, a Sn—Ag—Cu alloy, or the like, and may be lead-free. Alternatively, the solder regions 128 may be formed by a printing process depositing solder paste on the metal pillars 124. In such embodiments, the plating mask 126 can serve as a printing mask and solder paste can be wiped across the plating mask 126 in the openings. The solder paste may then be reflowed to form the solder regions 128. For example, the solder regions 128 may be formed to a thickness T4 ranging from 3 μm to 5 μm, such as 3.5 μm to 4.5 μm.

Figure 5:
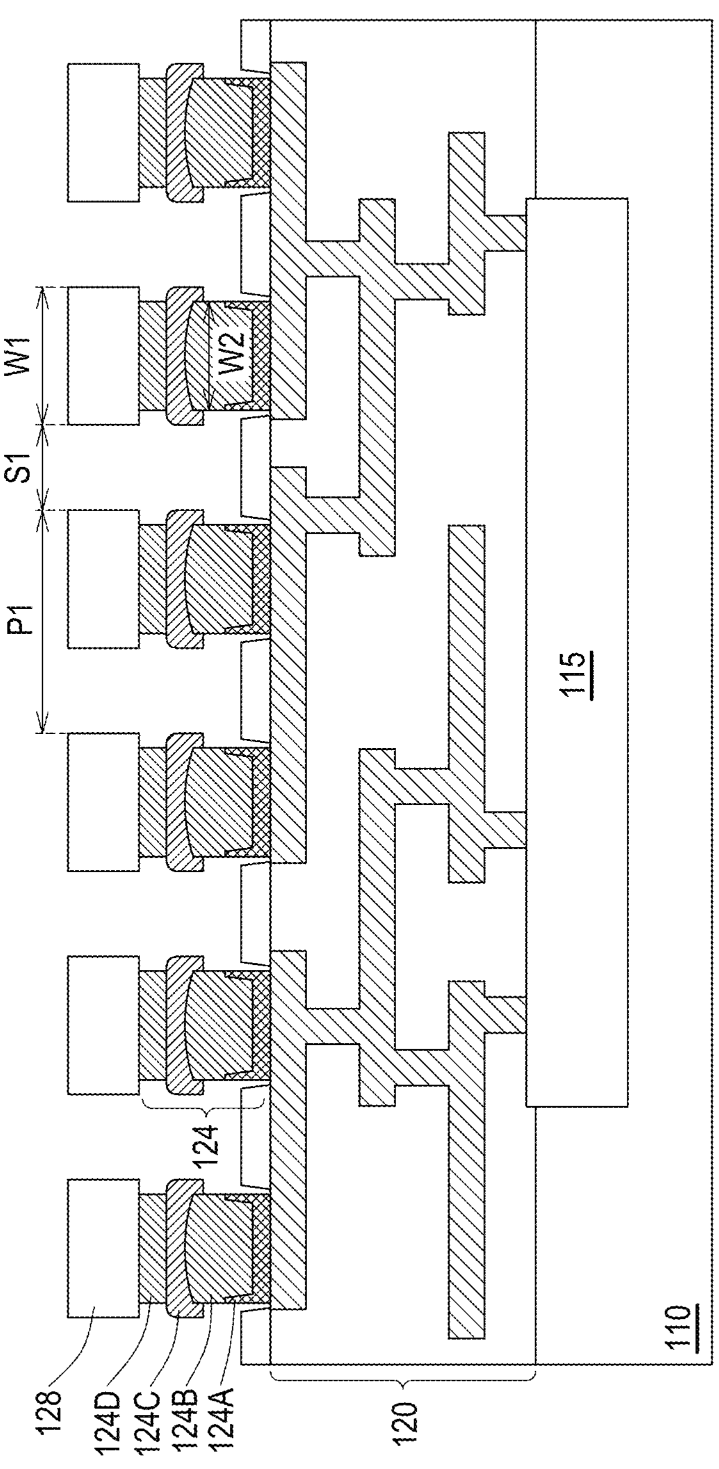

In FIG. 5, after plating the solder regions 128, the plating mask 126 is removed and one or more etch processes are performed to remove exposed portions of the seed layer 124A and to recess sidewalls of the copper layers of the metal pillars 124. For example, the plating mask 126 may be removed by a stripping process, such as by an ashing process. Removing the plating mask 126 uncovers and exposes portions of the seed layer 124A between the metal pillars 124.

In some embodiments, the exposed portions of the seed layer 124A and sidewalls of the copper layers of the metal pillars 124 are etched simultaneously. The exposed portions of the seed layer 124A include those portions that were previously covered by the plating mask 126. As discussed above, the copper layers of the metal pillars 124 may include the base layer 124B and the capping layer 124D. For example, the seed layer 124A, the base layer 124B, and the capping layer 124D may be etched using etchants that are selective to copper as compared to other materials in the metal pillars 124 (e.g., nickel, iron-cobalt, or the like) and the solder regions 128 (e.g., Cu—Sn alloy). The portions of the seed layer 124A covered by the metal pillars 124 remain substantially un-removed. However, portions of the seed layer 124A that become exposed during etching of the base layer 124B may also be removed. Throughout the description, the remaining portions of the seed layer 124A are considered as integral to and part of the metal pillars 124. (Note that, for the sake of simplicity, some subsequent figures may not specifically illustrate these remaining portions of the seed layer 124A.) The resulting connector structure 130 includes the metal pillars 124 and solder regions 128.

As illustrated, the materials of the intermediate layer 124C (e.g., nickel, iron-cobalt, and/or the like) and the solder region 128 (e.g., a Cu—Sn alloy) may remain substantially unetched. As a result, after performing the etch process, sidewalls of the base layer 124B and the capping layer 124D are recessed from sidewalls of the intermediate layer 124C and the solder region 128. In some embodiments, the metal pillars 124 and the solder regions 128 may have initially been deposited with a width W1 ranging from 6 μm to 7 μm. Following the etch process, the base layer 124B and the capping layer 124D may be recessed by a distance ranging from 0.5 μm to 1 μm, such that those layers have a width W2 ranging from 5 μm to 6 μm.

Embodiments may utilize a narrow pitch set. For the purposes of this disclosure, a narrow pitch set is considered to be where the pitch P1 between adjacent ones of the metal pillars 124 is less than or equal to 10 μm, such as between 5 μm and 10 μm. In some embodiments, wider pitch sets may also utilize the embodiments. The wider pitch sets may include a pitch P1 greater than 10 μm, such as between about 15 μm and 200 μm. In the narrow pitch set, the widths W1/W2 of the connector structures 130 (e.g., the metal pillars 124 and the solder regions 128) may be between about 0.5 μm and about 8 μm, the spacing Si between the connector structures 130 may be between about 3 μm and about 9 μm.

Figure 6:
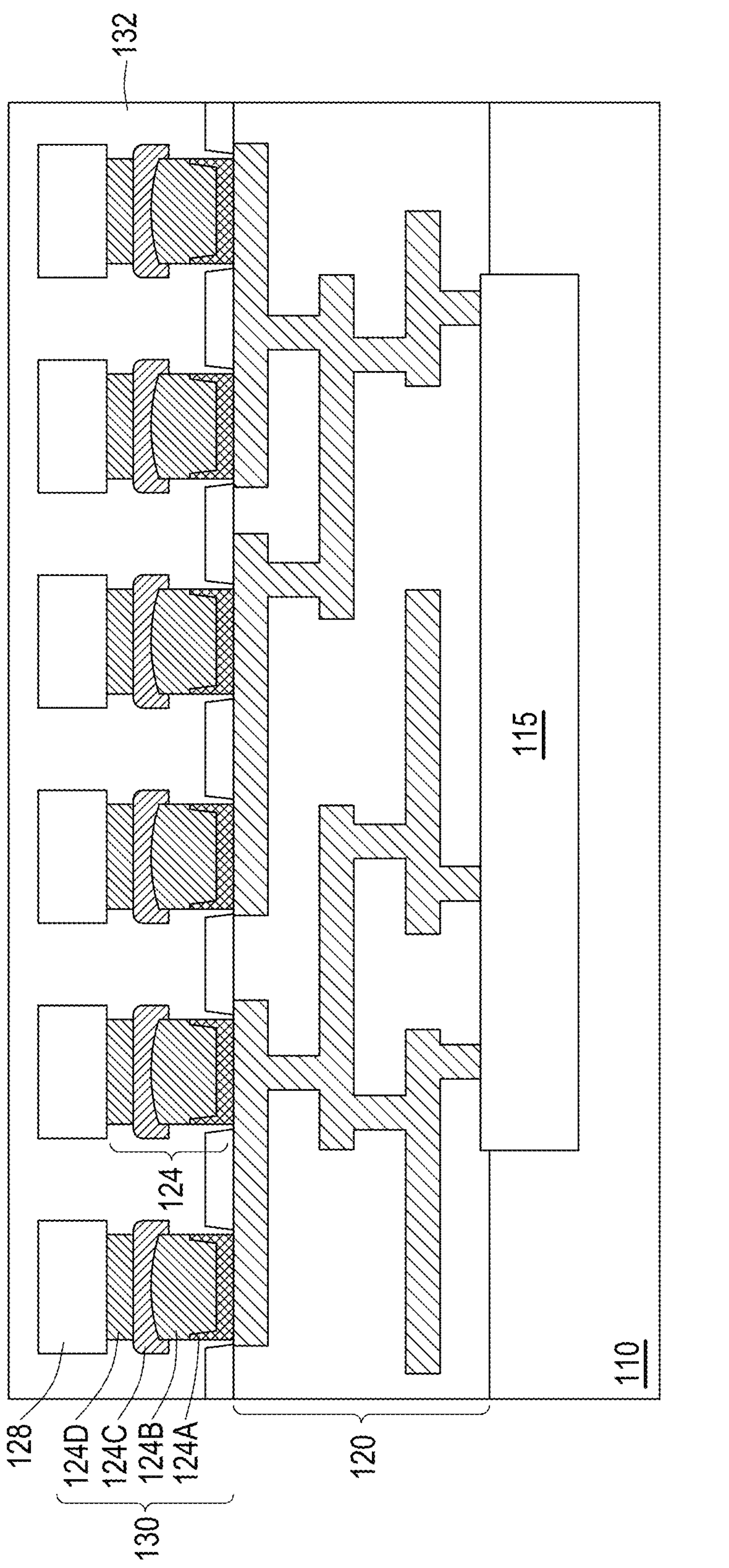

In FIG. 6, an infill film 132 is deposited over and between the connector structures 130 (e.g., the metal pillars 124 and the solder regions 128). The infill film 132 may be any suitable insulating film, such as a polymer such as a polyimide, solder resist, polybenzoxazole (PBO), a benzocyclobutene (BCB) based polymer, or molding compound. The infill film 132 may be deposited using any suitable process, such as by CVD, spin coating, lamination, the like, or a combination thereof.

Figure 7:
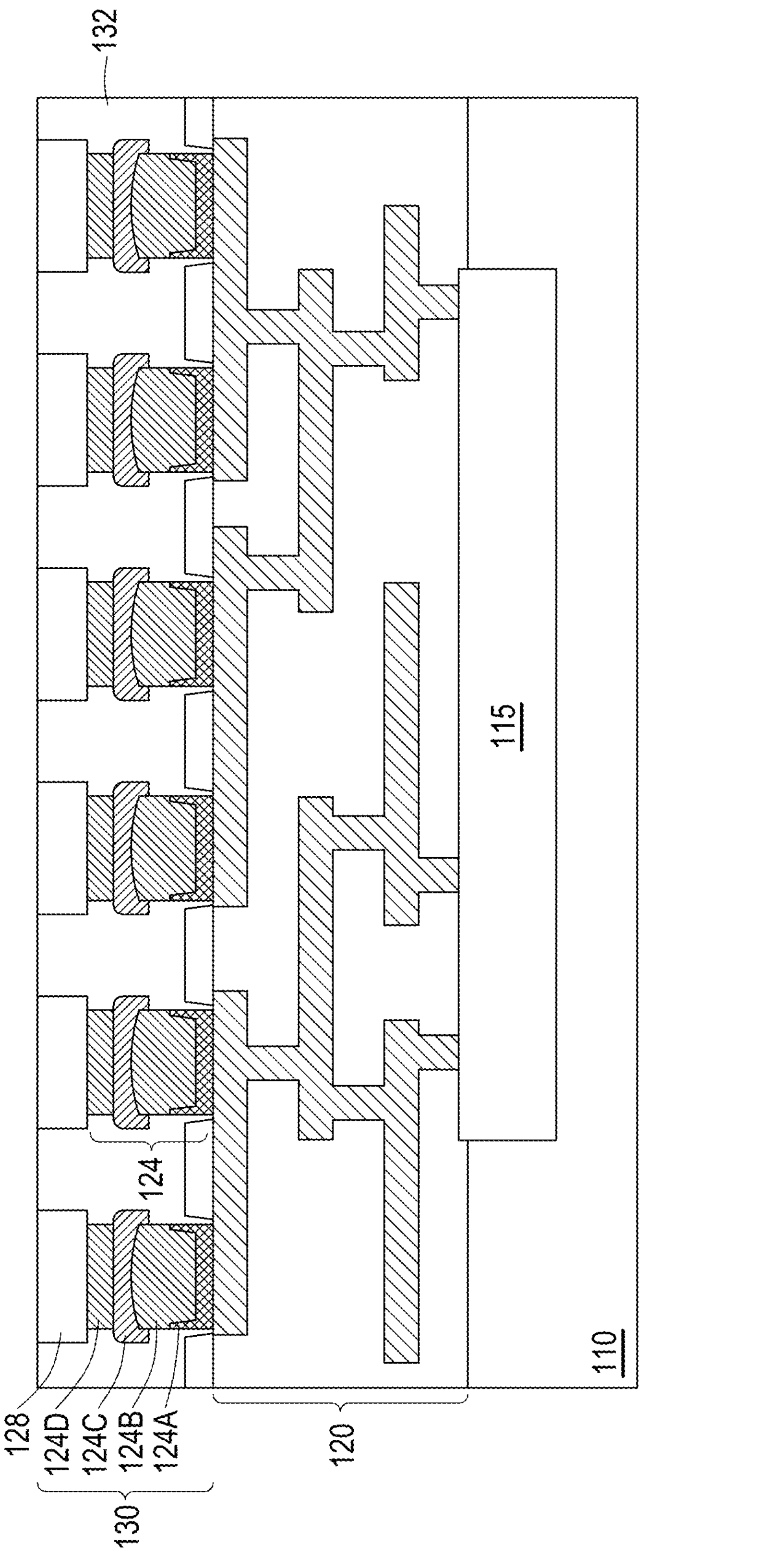

In FIG. 7, a planarization process is performed to level upper surfaces of the infill film 132 with upper surfaces of the solder regions 128 of the connector structures 130, to form infill structures 134. The planarization process may include a mechanical grinding or polishing process or may include a chemical mechanical polishing (CMP) process.

Figure 8:
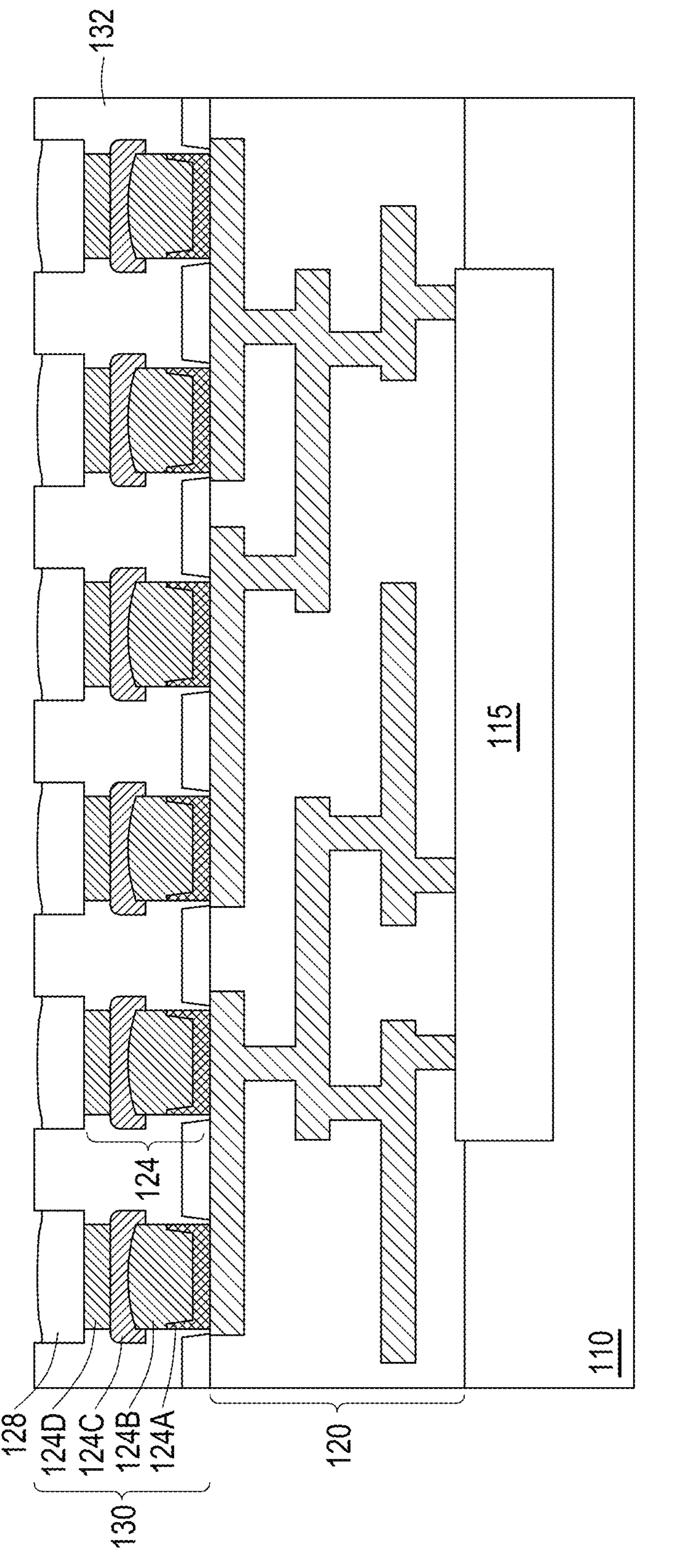

In FIG. 8, an optional reflow process may be performed on the solder regions 128. The reflow process may be performed to melt the solder regions 128 and cause the solder regions 128 to form a domed or rounded shape. In reflowing the solder regions 128, the upper surface of the solder regions 128 may pull away at the edges and recess below the upper surface of the infill structures 134 and the apex of the domed shape of the solder regions 128 may protrude above the upper surface of the infill film 132. As such, the sidewalls of the infill film 132 may be exposed from the solder regions 128 at their uppermost portions. The optional reflow process may be a convection reflow process, laser reflow process, or the like.

Figure 9:
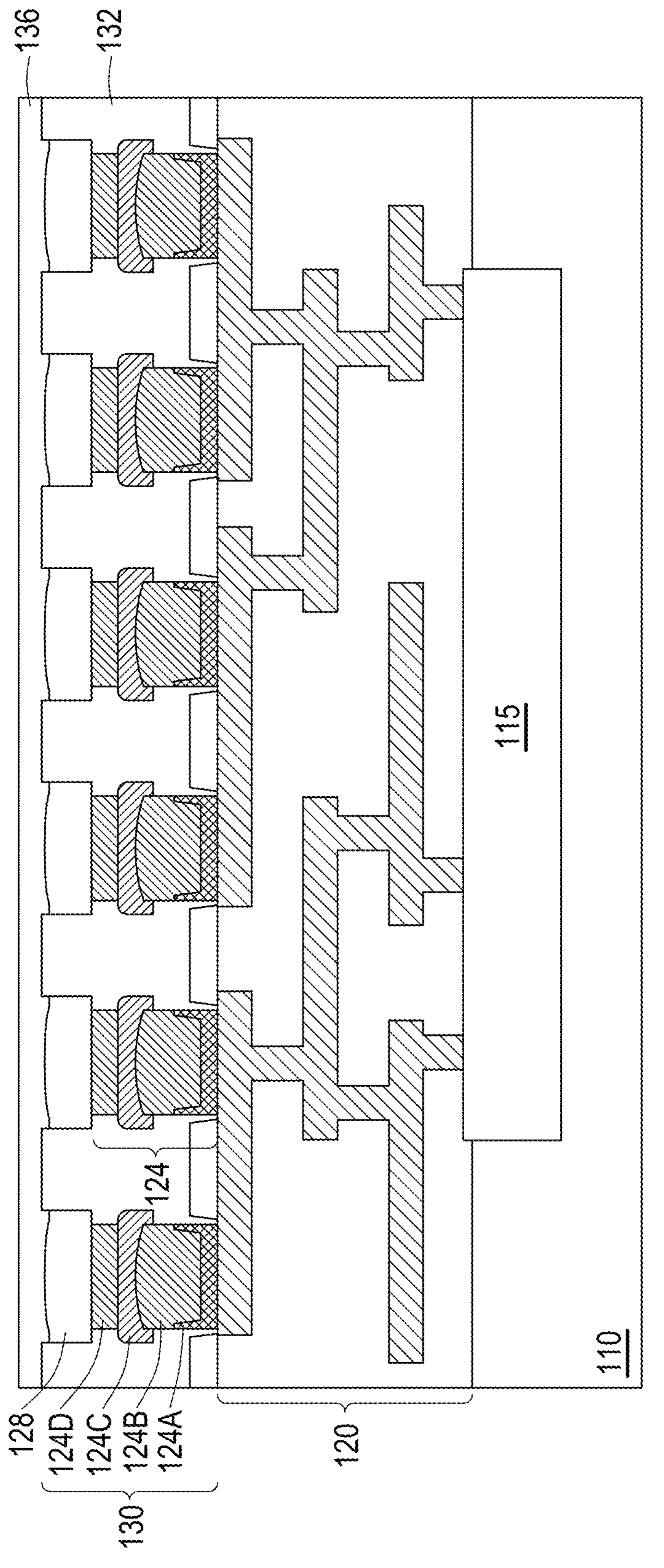

In FIG. 9, a non-conductive film (NCF) 136 is deposited over the infill film 132 and over the solder regions 128. The NCF 136 will assist in coupling the solder regions 128 to corresponding solder regions of a package component. For example, the NCF 136 may contain flux to improve or promote solder reflow and de-oxidation. The NCF 136 may be any suitable material composition. In some embodiments, the NCF 136 may be a coating adhesive with flux or an epoxy resin with filler and flux. The NCF 136 may be a compressible film and may be formed by any suitable process, such as by lamination, spin-on, spraying, jetting, dipping, or the like, and may be formed to a thickness between about 5 μm and about 10 μm.

Figure 10:
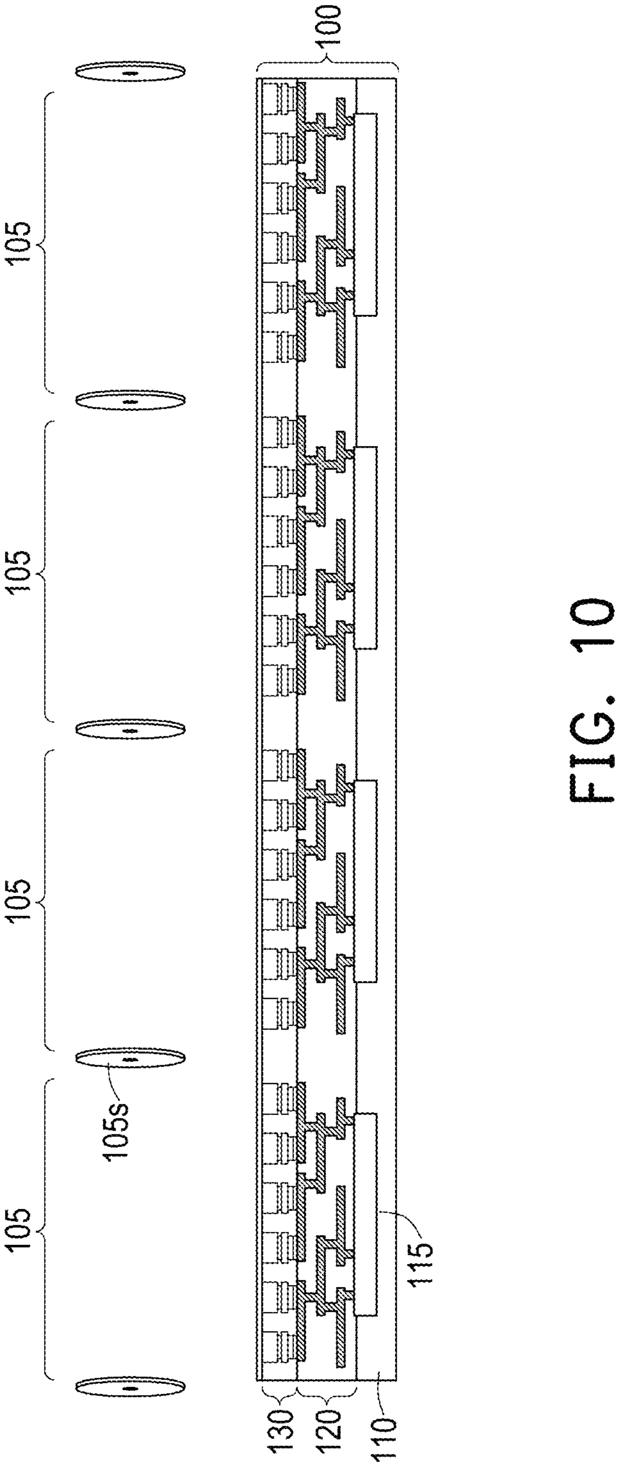

In FIG. 10, the wafer 100 is singulated in a singulation process. The singulation process may include a die-saw process, an etching process, a laser cutting process, the like, or combinations thereof. The singulation process is performed along scribe lines (not specifically illustrated) between the die regions 105. The singulated components may be referred to as package components 150 (see FIG. 11), which may be device dies, package substrate, interposers, packages, or the like.

Figure 11:
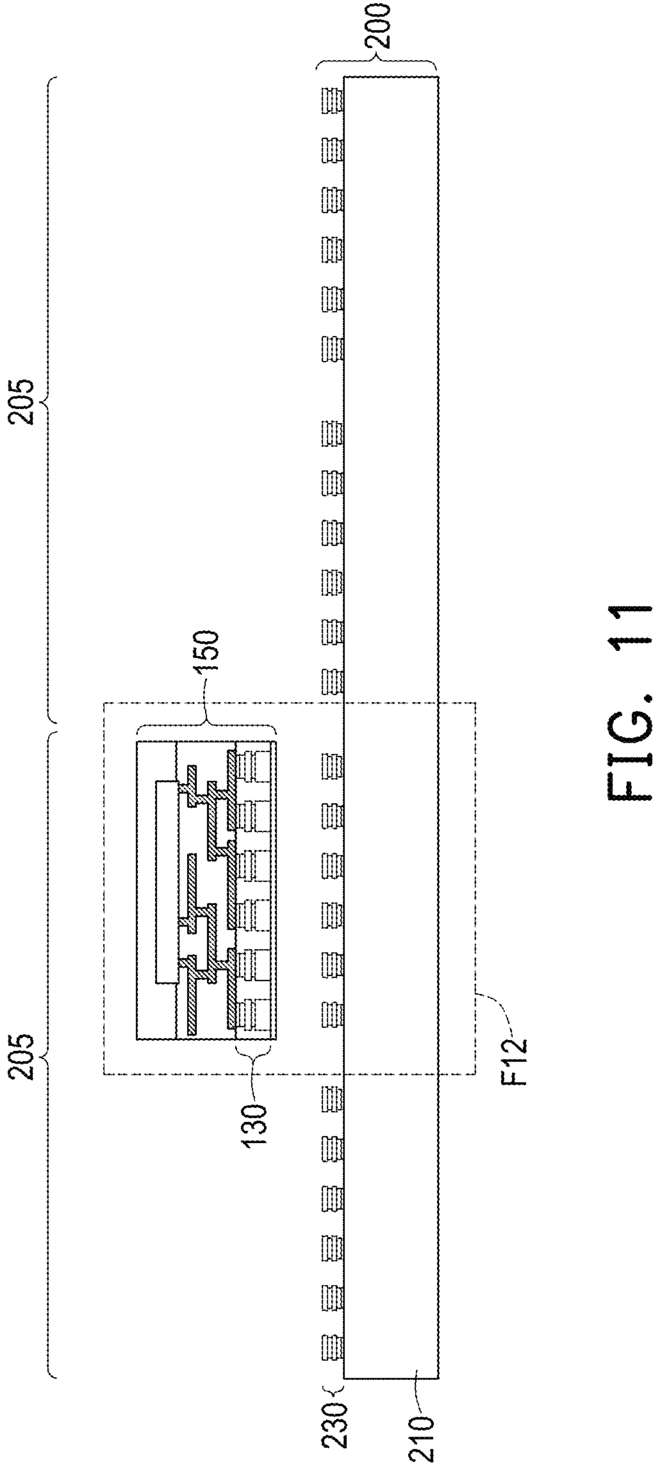
FIGS. 11-18B illustrate intermediate stages in the bonding of package components to form a semiconductor package, in accordance with some embodiments.

In FIG. 11, a package component 200 is provided, which may be an interposer, a package substrate, a package, a device die, a printed circuit board, or the like. The package component 200 includes a substrate 210 and connector structures 230 protruding from the substrate 210. The connector structures 230 are set at the same pitch as the connector structures 130 of the package components 150. In some embodiments, the substrate 210 may include a passivation layer (not specifically illustrated) which includes openings that the connector structures 230 may extend through, similarly as described above in connection with the connector structures 130 and the passivation layer 122.

The connector structures 230 may be formed similarly as described above in connection with the connector structures 130, albeit with certain differences as discussed below. For example, each of the connector structures 230 may include a metal pillar 224 and a solder region 228. In addition, the metal pillar 224 may include a seed layer 224A (not specifically illustrated), a base layer 224B, one or more intermediate layer(s) 224C, and a capping layer 224D. Further, the metal pillars 224 (including the individual components) may be formed similarly as described above in connection with the metal pillars 124, and the solder regions 228 may be formed similarly as described above in connection with the solder regions 128.

In accordance with some embodiments, the base layer 224B may include any of the materials described in connection with the base layer 124B (e.g., copper), the intermediate layer(s) 224C may include any of the materials described in connection with the intermediate layer(s) 124C (e.g., nickel or iron-cobalt), and the capping layer 224D may include any of the materials described in connection with the capping layer 124D (e.g., copper).

It should be appreciated that, in some embodiments, various features of the connector structures 230 of the package components 200 may be formed with different dimensions than analogous features of the connector structures 130 of the package components 150. In particular, the base layer 224B may be formed to a thickness T5 ranging from 2 μm to 3 μm, the intermediate layer(s) 224C may be formed to a thickness T6 ranging from 1 μm to 2 μm, and the capping layer 224D may be formed to a thickness T7 ranging from 3 μm to 4 μm. In addition, the solder regions 228 may be formed to a thickness T8 ranging from 2 μm to 3 μm.

After forming the metal pillars 224 and the solder regions 228, an etch process may be performed to remove exposed portions of the seed layer 224A and recess sidewall portions of the metal pillars 224, similarly as described in connection with the metal pillars 124 (see FIG. 5). For example, the seed layer 224A, the base layer 224B (e.g., copper), and the capping layer 224D (e.g., copper) may be etched using etchants that are selective to copper as compared to other materials in the metal pillars 224 (e.g., nickel, iron-cobalt, or the like) and the solder regions 228 (e.g., Cu—Sn alloy). The portions of the seed layer 224A covered by the base layer 224B remain substantially un-removed. However, portions of the seed layer 224A that become exposed during etching of the base layer 224B may also be removed.

As illustrated, the materials of the intermediate layer 224C (e.g., nickel, iron-cobalt, and/or the like) and the solder region 228 (e.g., a Cu—Sn alloy) may remain substantially unetched. As a result, after performing the etch process, sidewalls of the base layer 224B and the capping layer 224D are recessed from sidewalls of the intermediate layer 224C and the solder region 228. In some embodiments, the metal pillars 224 and the solder regions 228 may have initially been deposited with a width W3 ranging from 4 μm to 5 μm. Following the etch process, the base layer 224B and the capping layer 224D may be recessed by a distance ranging from 0.5 μm to 1 μm, such that those layers have a width W4 ranging from 3 μm to 4 μm.

In some embodiments, the connector structures 230 may protrude between about 4 μm and 12 μm from the substrate 210. The connector structures 230 may have a width W3 which is between about 0.2 μm and 1 μm smaller than the width W1 of the connector structures 130. In other embodiments (not specifically illustrated), the width W3 of the connector structures 230 may be substantially the same or larger than the width W1. The connector structures 230 may be coupled to conductive features embedded in the substrate 210, which are not specifically illustrated, but may include an interconnect structure, similar to the interconnect structure 120, a device region, similar to the device region 115, or other conductive features. In some embodiments, the substrate 210 may be a wafer having multiple device regions 205 disposed therein, which can be singulated in a subsequent singulation process. The substrate 210 may include any of the candidate materials as those discussed above for the substrate 110.

Sill referring to FIG. 11, the connector structures 130 of the package component 150 are aligned to selected ones of the connector structures 230. The alignment may be accomplished by a pick and place process. Although one package component 150 is illustrated, it should be appreciated that additional package components, including additional package components 150, may be used. The dashed box F12 is provided in magnified views in FIGS. 12A-12B.

Figure 12A:
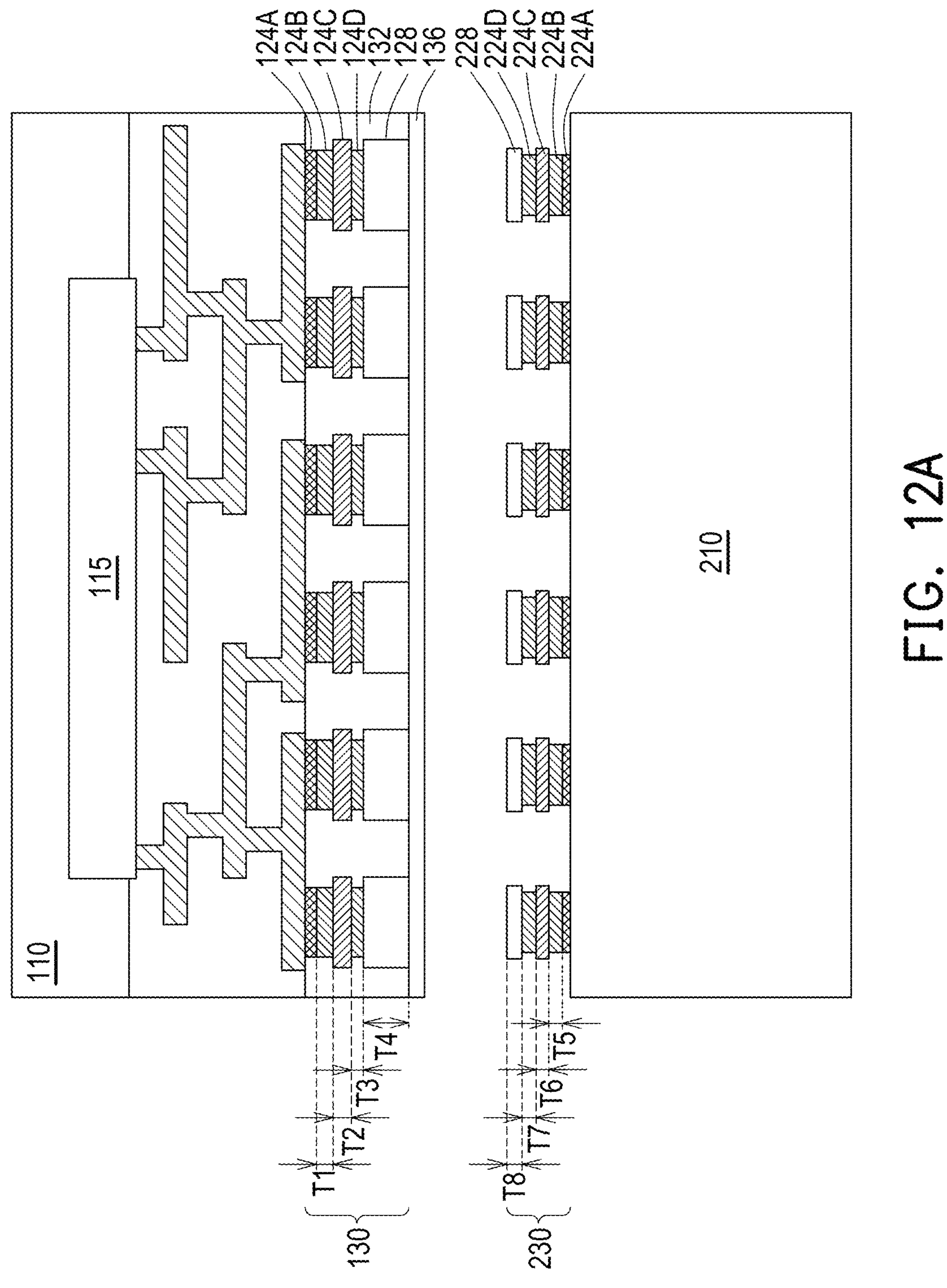
Figure 12B:
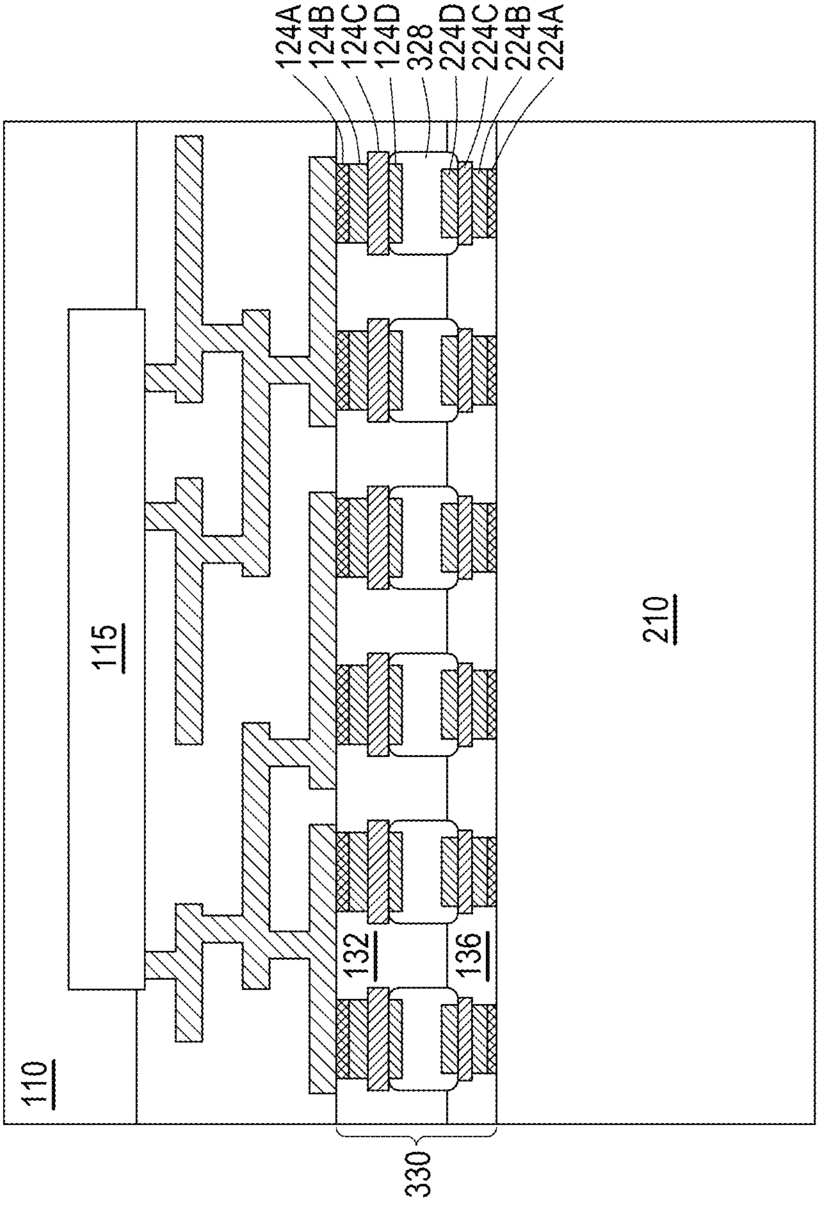
Figure 12C:
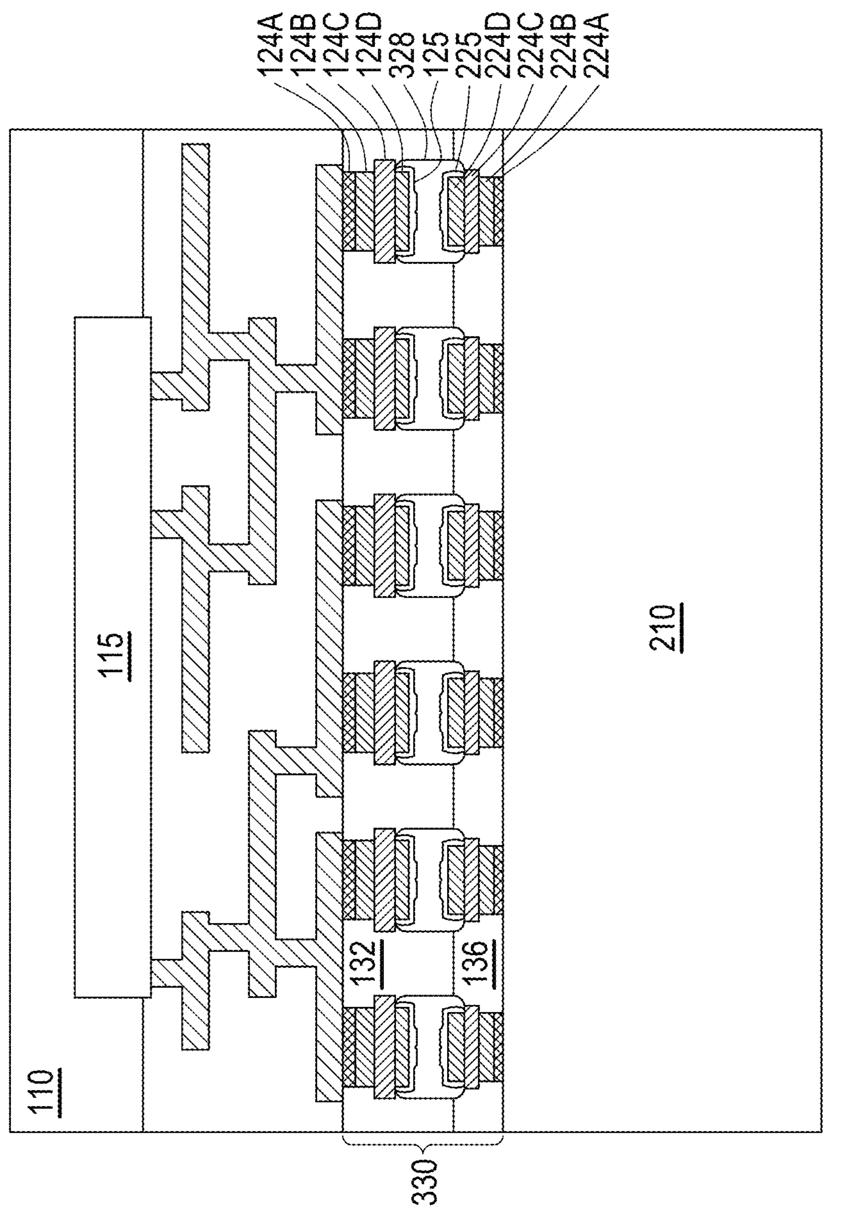

In FIGS. 12A and 12B, the package component 150 is brought to the package component 200 and pressed into the package component 200. FIG. 12A illustrates the package component 150 aligned with the package component 200, and FIG. 12B illustrates the package components 150/200 bonded to one another. Upon pressing the package component 150 to the package component 200, the connector structures 230 of the package component 200 penetrate through the NCF 136 to contact the solder regions 128 of the package component 150. As the connector structures 230 of the package component 200 penetrate the NCF 136, the NCF 136 surrounds and contacts the sidewalls of the metal pillars 224. The dashed boxes F13A and F13B are provided in magnified views in FIGS. 13A and 13B, respectively. After bonding, the connector structure 130 and the connector structure 230 may collectively be referred to as a bonded connector structure 330.

Figures 13A, 13B, 13C:
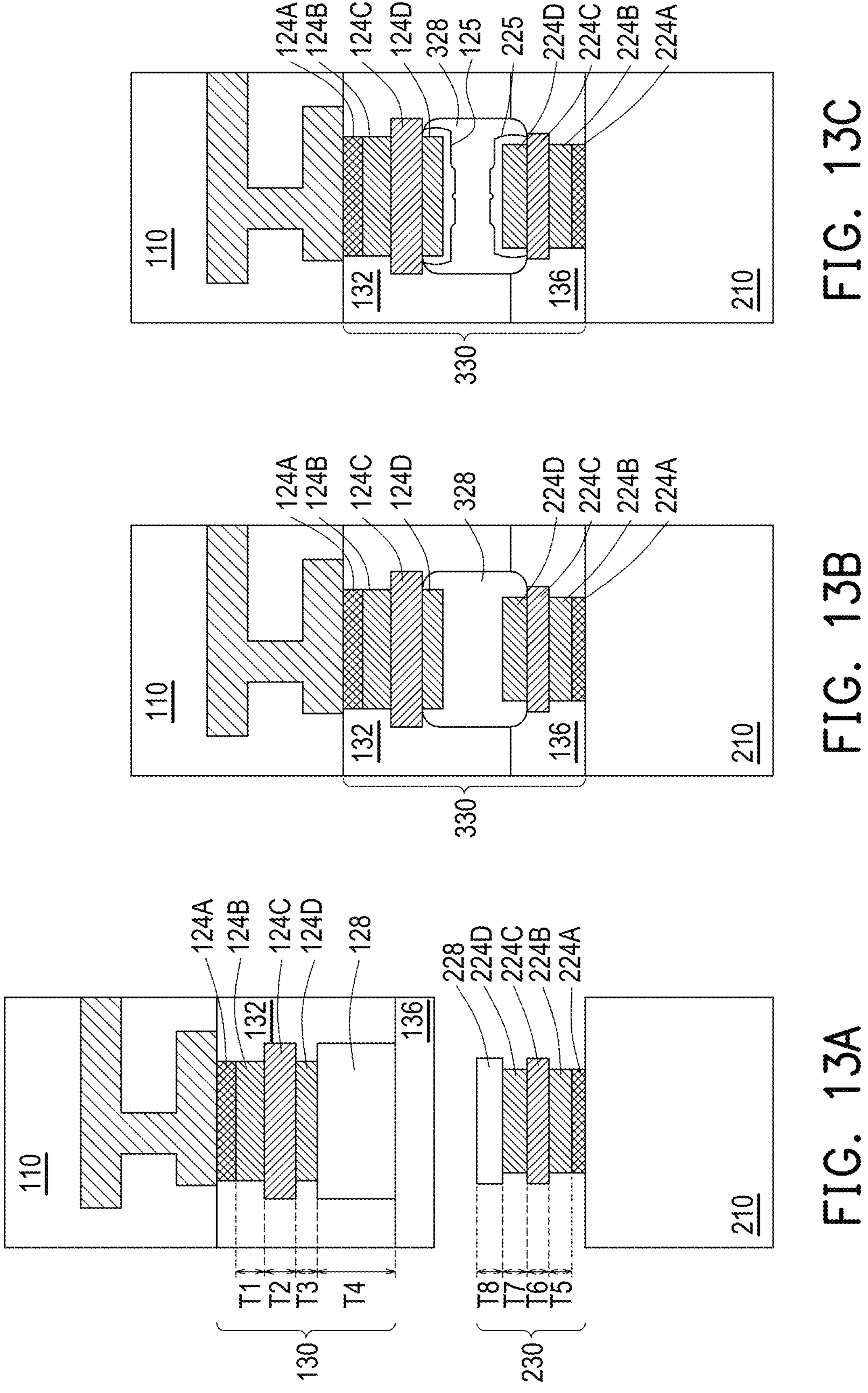

In FIGS. 13A-13C, enlarged views of the connector structures 130/230/330 are provided before bonding (see FIGS. 12A and 13A), during or immediately after bonding (see FIG. 13B), and after testing, storage, and/or use (see FIGS. 12B and 13C). As illustrated, the metal pillars 224 are brought to the surface of the solder regions 128 and are surrounded by the NCF 136. Because the NCF 136 may be a compressible film, the NCF 136 may fill the spaces between the metal pillars 224 and may contact the surface of the package component 200.

In some embodiments, during bonding, the solder regions 128 may partially surround the solder regions 128 due to differences in the respective widths W1/W3. In addition, the solder regions 128 may merge with the solder regions 128 to such that a boundary between them becomes indistinguishable, thereby resulting in merged solder regions 328. Moreover, the solder region 128 may further extend around the capping layer 224D and toward the intermediate layer 224C, which serves as a physical barrier to prevent the solder region 128 (e.g., the merged solder region 328) from reaching the base layer 224B or the substrate 210. Similarly, the solder region 128 may be pushed backward around the capping layer 124D and toward the intermediate layer 124C, which also serves as a physical barrier to prevent the solder region 128 (e.g., the merged solder region 328) from reaching the base layer 124B or the passivation layer 122.

As illustrated, the merged solder regions 328 may make physical contact with either or both of the intermediate layers 124C/224C while surrounding the sidewalls of the capping layers 124D/224D. During the bonding process as well as subsequent stress testing (e.g., thermal cycle testing), storage, and functional use of the completed semiconductor device, elements within the merged solder regions 328 tend to diffuse into adjacent features, such as adjacent conductive features. For example, in embodiments in which the solder regions 128/228 comprise a Cu—Sn alloy, then the copper and tin may diffuse into the metal pillars 124 and the metal pillars 224. Similarly, in embodiments in which either or both of the intermediate layers comprise nickel, then the nickel may diffuse into the merged solder regions 328. As discussed in greater detail below, these differing and opposing diffusions of, e.g., copper, tin, and nickel cause changes to the structure of the bonded connector structures 330 over time.

As compared to tin atoms (e.g., within the merged solder regions 328) and nickel atoms (e.g., within the intermediate layers 124C/224C), the copper atoms (e.g., within the merged solder regions 328 and the capping layers 124D/224D) have a higher rate of diffusion through the bonded connector structure 330. The imbalance of these rates in conjunction with the varying directions of diffusion can lead to voids or other structural weaknesses in the bonded connector structures 330. However, the composition, location, and dimensions of the intermediate layers 124C/224C create a physical and chemical barrier that reduces these diffusions or the effects thereof. As discussed above, the widths W1/W2 of the intermediate layers 124C/224C provide a physical barrier to hold the merged solder regions 328 in a confined area between the intermediate layers 124C/224C. In addition, the composition of the intermediate layers 124C/224C (e.g., nickel and/or an iron-cobalt alloy) provide a chemical barrier to slow or stop diffusion of copper atoms there-through.

As a result of these features and phenomena, the embodiment designs of the connector structures 130/230/330 (e.g., including the intermediate layers 124C/224C) may reduce the above-described metal diffusions. The reduced diffusions prevents formation of voids (e.g., Kirkendall voids) in and around the capping layers 124D/224D and the merged solder region 328. The resulting semiconductor device maintains stronger bonds and more robust electrical connections between the package components 150/200 during fabrication, testing, packaging, storage, and functional use.

As noted above, FIGS. 12B and 13C may be indicative of the bonded connector structures 330 after testing, storage, and/or use, whereas FIG. 13B may be indicative of the bonded connector structures 330 shortly after the bonding process. In particular, diffusion of copper, tin, and nickel during those latter processes may eventually cause a change to the composition of the merged solder region 328 while forming one or more additional intermetallic layers.

For example, disproportionate diffusion of copper out of the merged solder region 328 and diffusion of nickel into the merged solder region 328 may result in an overall decrease in a copper concentration (e.g., atomic ratio) within the merged solder region 328. In embodiments in which the solder regions 128/228 are deposited as $Cu_xSn_y$ alloys, the value of x may decrease while the value of y increases (e.g., the ratio of y:x may increase). In addition, diffusion of nickel into the merged solder region 328 has an additional effect on the changing composition of the merged solder region 328. For example, the solder regions 128/228 may be deposited as a $Cu_3Sn$ alloy, and the merged solder region 328 may eventually change in composition to a $(Cu,Ni)_6Sn_5$ alloy. In some embodiments, the ratio of nickel-to-copper will differ in various parts of the merged solder region 328, such as being greater in regions proximal to the intermediate layers 124C/224C and lesser in regions distal from the intermediate layers 124C/224C (e.g., a center region of the merged solder region 328). For example, the ratio of nickel-to-copper in regions proximal to the intermediate layers 124C/224C may be up to about 0.5-3, whereas the center region may be substantially $Cu_6Sn_5$.

Moreover, following the bonding (and subsequent testing, storage, and/or use) an intermetallic compound (IMC) layer 125 may form along the boundary between the merged solder region 328 and the capping layer 124D, and an intermetallic compound (IMC) layer 225 may form along the boundary between the merged solder region 328 and the capping layer 224D. In some embodiments, the IMC layers 125/225 comprise $(Cu,Ni)_6Sn_5$ alloy and may further comprise a Cu—Sn alloy (e.g., $Cu_3Sn$).

It should also be appreciated that, immediately following the bonding process, the merged solder region 328 may comprise a composition substantially the same as the composition of the solder regions 128/228 when deposited. For example, the merged solder region 328 may be Cu—Sn (e.g., $Cu_3Sn$, $Cu_6Sn_5$, or a combination thereof) without a significant flux of copper, tin, and nickel (e.g., an out-flux of copper, an out-flux of tin, an influx of nickel, or combinations thereof). For example, the merged solder region 328 may include a substantially continuous composition in the center region as compared with regions proximal to the capping layers 124D/224D and the intermediate layers 124C/224C. As such, the merged solder region 328 may not include the IMC layers 125/225 until subsequent testing, storage, and/or functional use.

Figures 14A, 14B, 14C:
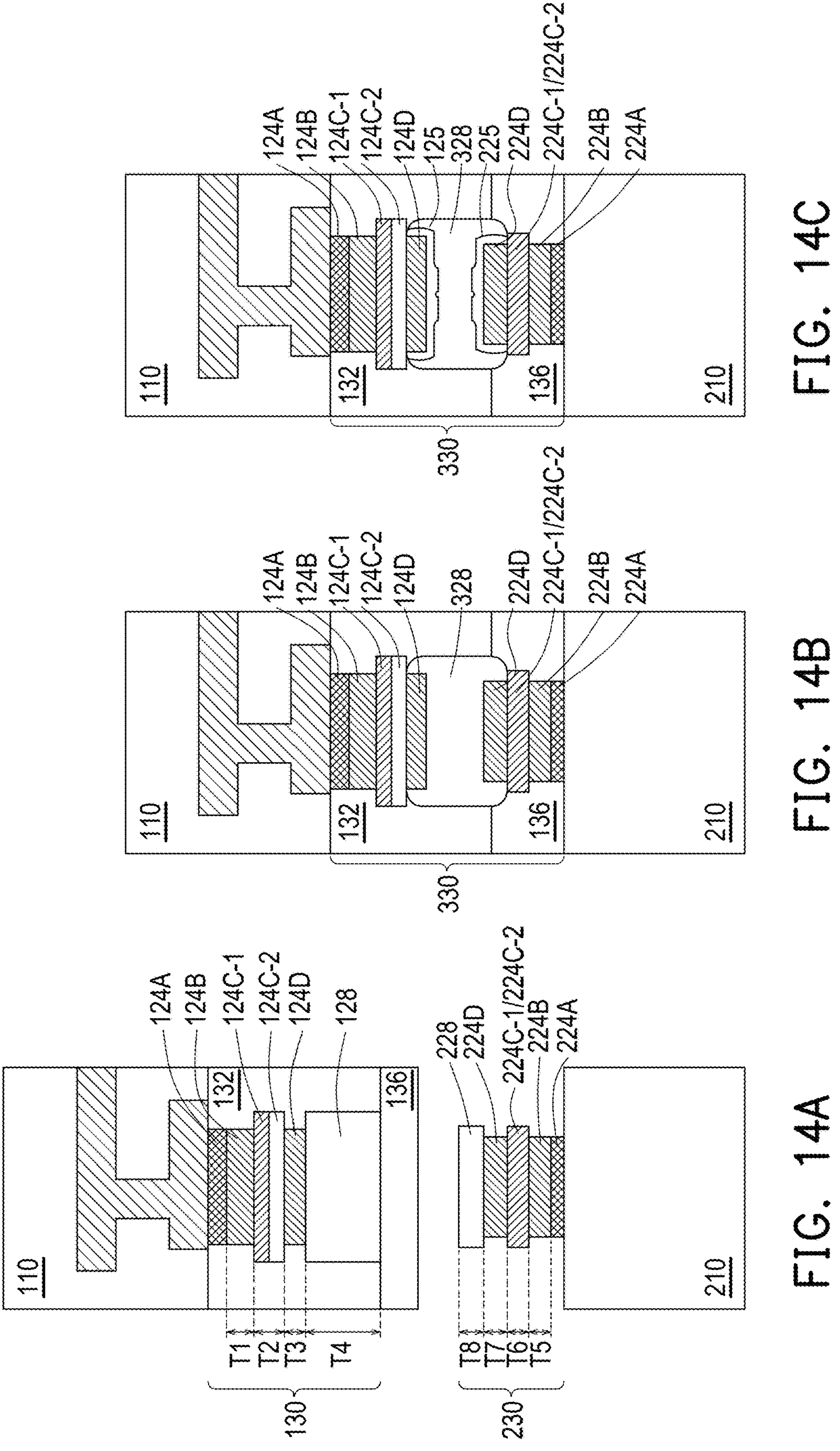

In FIGS. 14A-14C, one or both of the intermediate layers 124C/224C may be a bi-layer, in accordance with various embodiments. For example, the intermediate layer 124C may include a first layer 124C-1 comprising nickel and a second layer 124C-2 comprising iron-cobalt. However, the second layer 124C-2 of the bi-layer may be a palladium-containing layer, a gold layer, or the like. In addition, the first layer 124C-1 of the intermediate layer 124C may be more proximal to the base layer 124A and the second layer 124C-2 being more proximal to the capping layer 124D (as illustrated), or vice versa. FIG. 14A illustrates the connector structures 130/230 before bonding, FIG. 14B illustrates the bonded connector structure 330 shortly after bonding, and FIG. 14C illustrates that bonded connector structure 330 after testing, storage, and/or use.

The bi-layer intermediate layer 124C and the intermediate layer 224C achieve similar benefits as described above to reduce diffusion of copper and other elements and prevent voids in and around the capping layers 124D/224D and the merged solder region 328 during bonding or subsequent processes relating to testing, storage, or use. In addition, IMC layers 125/225 may form similarly as described above. It should be appreciated that in embodiments in which the first layer 124C-1 of the bi-layer intermediate layer 124C is nickel, the IMC layer 125 and regions of the merged solder region 328 proximal to the intermediate layer 124C may have lower nickel concentrations (e.g., being free of nickel) than the IMC layer 225 and regions of the merged solder region 328 proximal to the intermediate layer 224C.

In accordance with various embodiments, the bi-layer intermediate layer(s) 124C/224C may have a total thickness T2/T6 as described above, such that the first layer 124C-1/224C-1 and the second layer 124C-2/224C-2 may have a substantially same thickness. However, the first layer 124C-1/224C-1 may comprise between 10% and 50% of the total thickness T2/T6.

Note that this embodiment may be utilized in a plurality of ways (not individually illustrated). For example, the intermediate layer 124C may have either of the above-described layouts or be omitted, and the intermediate layer 224C may have either of the above-described layouts or be omitted (such that at least one of these intermediate layers 124C/224C is included). As such, there may be eight combinations for utilizing this particular embodiment.

Figures 15A, 15B, 15C:
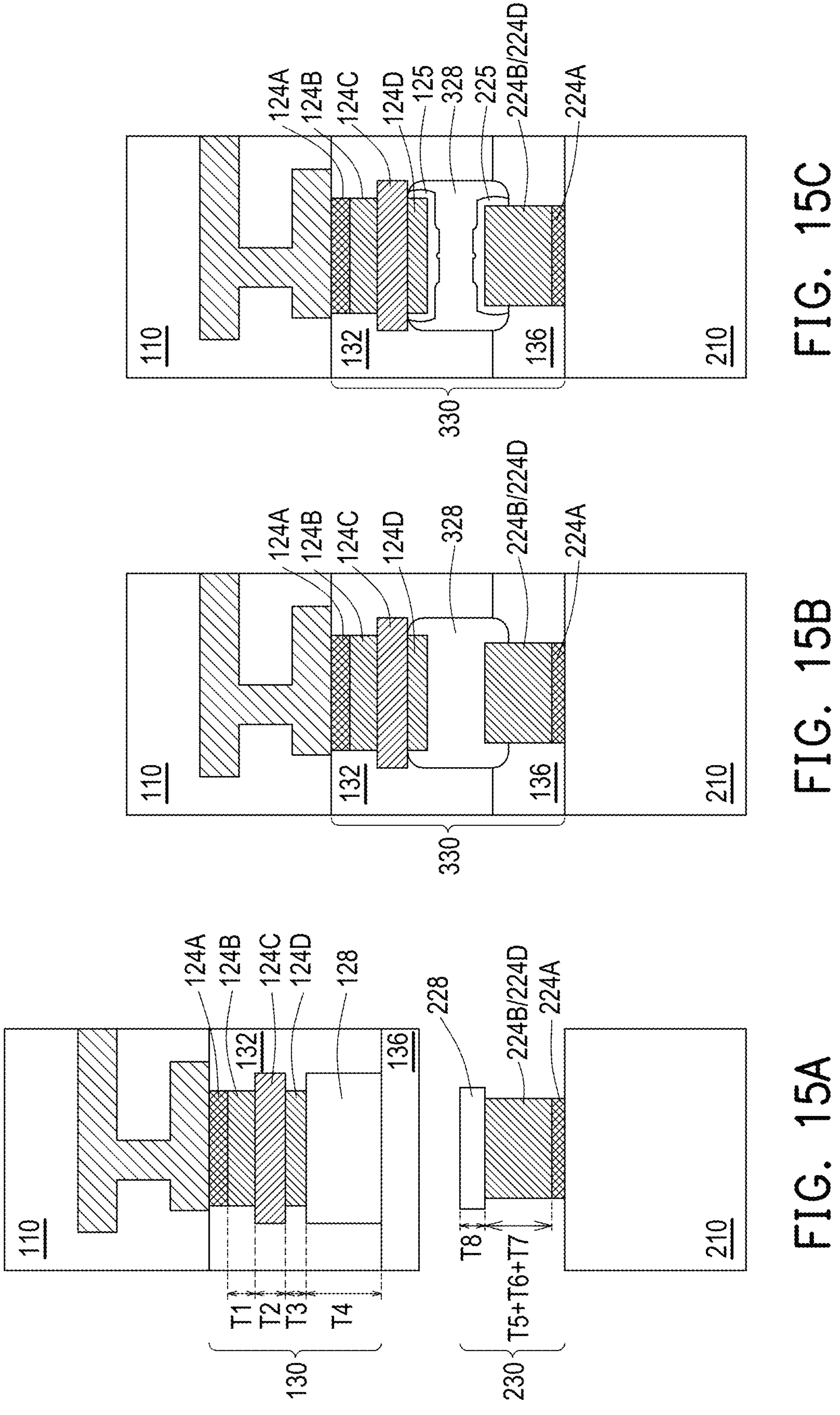
Figures 16A, 16B, 16C:
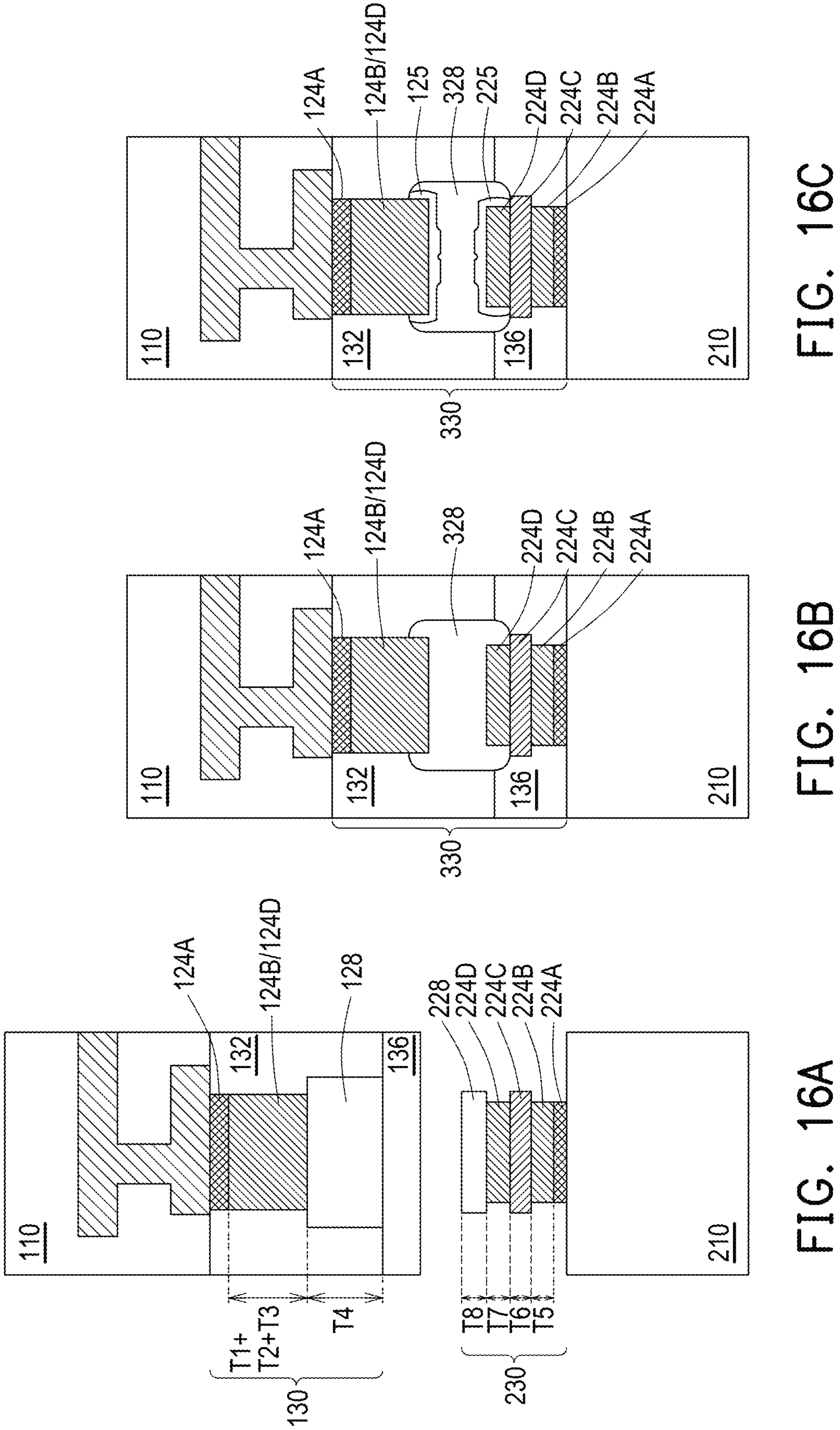

In FIGS. 15A-16C, one of the connector structures 130/230 includes a respective intermediate layer 124C/224C, while the other of the connector structures 130/230 does not include a respective intermediate layer 124C/224C. In particular, FIGS. 15A-15C illustrate the metal pillar 124 including the intermediate layer 124C, while the metal pillar 224 lacks the intermediate layer 224C. FIGS. 16A-16C illustrate the metal pillar 224 including the intermediate layer 224C, while the metal pillar 124 lacks the intermediate layer 124C. For example, the metal pillar 124 may include the intermediate layer 124C, while an entirety of the metal pillar 224 is the base layer 224B (or the capping layer 224D). Conversely, the metal pillar 224 may include the intermediate layer 224C, while an entirety of the metal pillar 124 is the base layer 124B (or the capping layer 124D).

Presence of only one of the intermediate layer 124C or the intermediate layer 224C may achieve similar benefits as described with respect to previous embodiments to reduce diffusion of copper and other elements and prevent voids in and around the capping layers 124D/224D and the merged solder region 328 during bonding or subsequent processes relating to testing, storage, or use. In addition, IMC layers 125/225 may form similarly as described above. It should be appreciated that the IMC layer 125/225 and regions of the merged solder region 328 proximal to the metal pillar 124/224 lacking the intermediate layer 124C/224C may have lower nickel concentrations (e.g., being free of nickel) than the analogous features proximal to the metal pillar 124/224 that includes the intermediate layer 124C/224C. In accordance with various embodiments, the metal pillar 124/224 that lacks the intermediate layer may have a thickness consistent with the sum of the corresponding base layer 124B/224B (e.g., thickness T1/T5), intermediate layer 124C/224C (e.g., thickness T2/T6), and capping layer 124D/224D (e.g., thickness T3/T7).

Figure 17A:
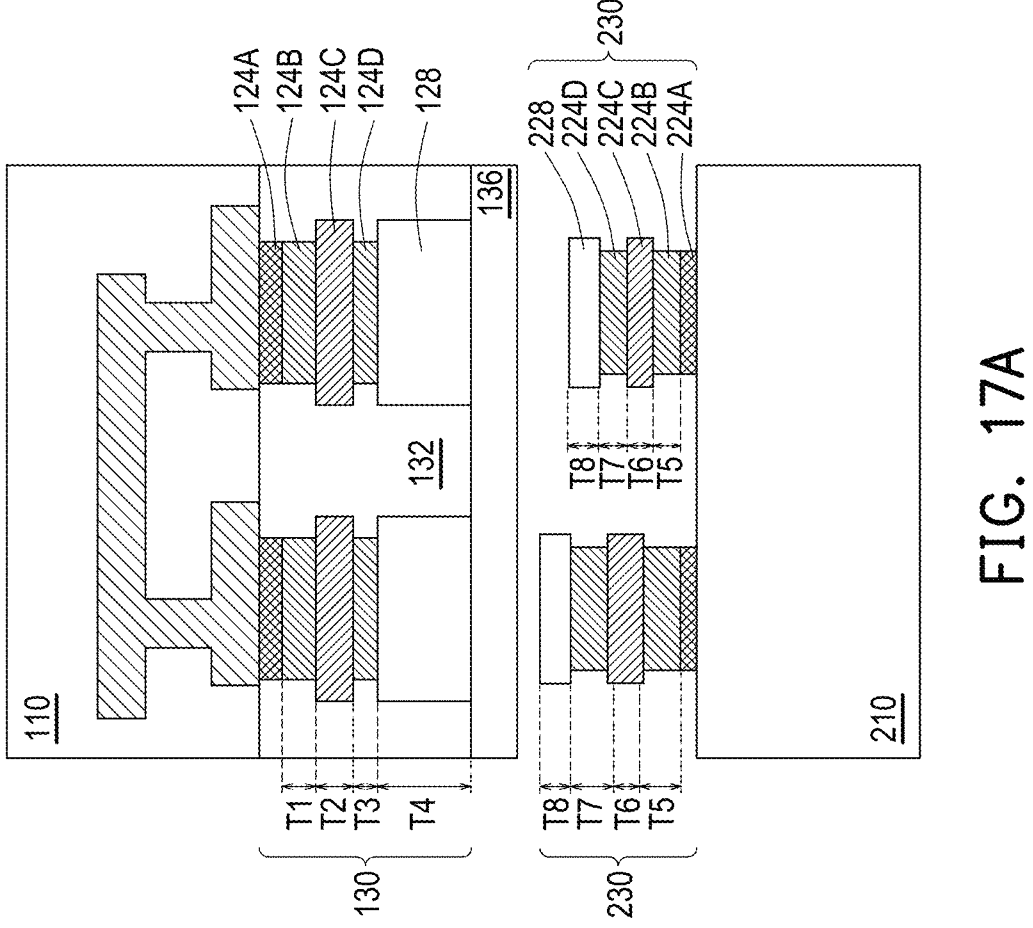
Figure 17B:
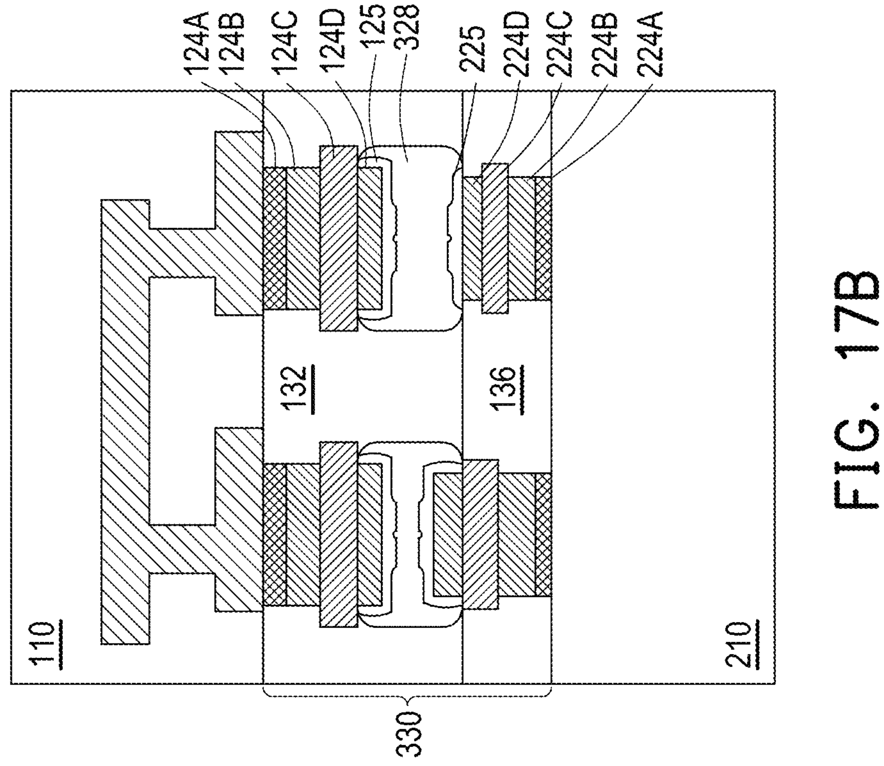

In FIGS. 17A and 17B, process variations and/or warpage of the wafer holding the package components 200 may result in variations in heights of the connector structures 230 with respect to making contact with the connector structures 130 during the bonding process. In some embodiments, process variations during formation of the connector structures 230 may result in varying thicknesses of its components, such as variations in one or more of thickness T5/T6/T7/T8. As a result of these phenomena, the variances among the connector structures 230 may range from about 1 μm to about 3 μm. As a result, some of the connector structures 230 (as compared to other connector structures 230) may penetrate further into corresponding connector structures 130. The penetration variance may also range from about 1 μm to about 3 μm.

As illustrated, the merged solder regions 328 of the lesser penetrating bonded connector structures 330 may not make physical contact with the corresponding intermediate layers 224C. As a result, nickel from those intermediate layers 224C may not diffuse into the merged solder regions 328 (or diffuse to a much lesser extent).

Figure 18A:
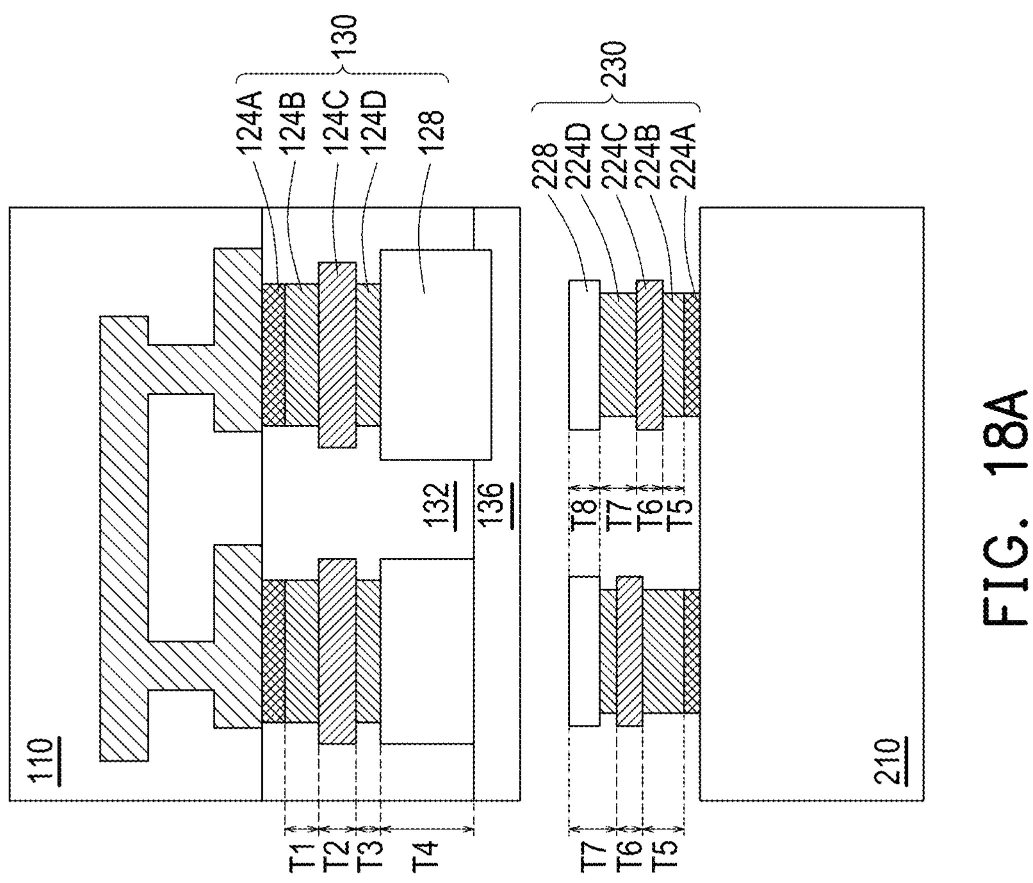
Figure 18B:
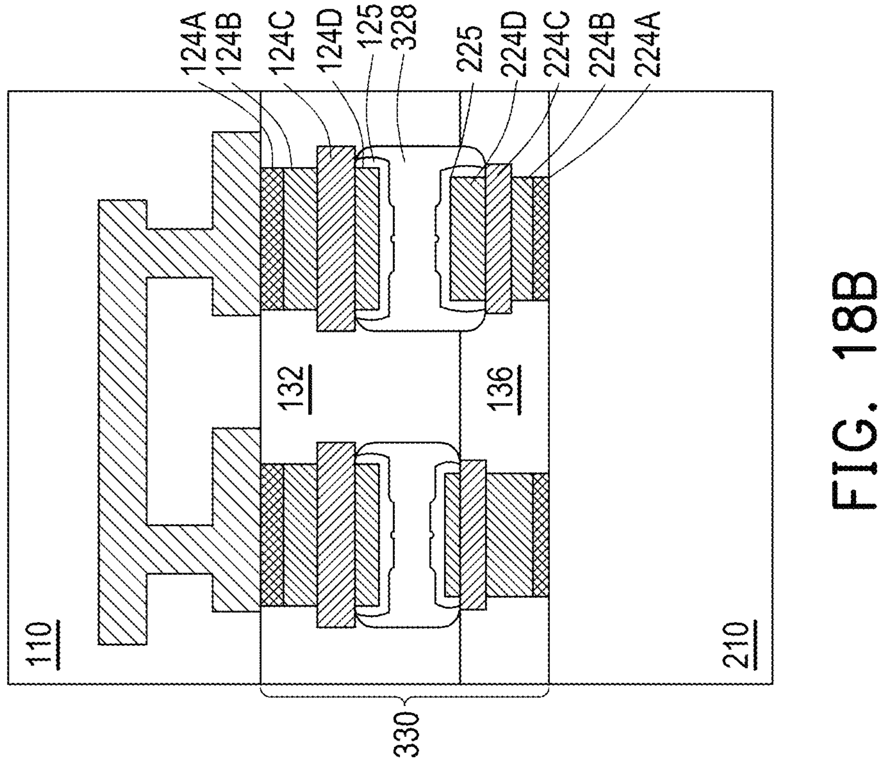

In FIGS. 18A and 18B, the connector structures 230 of the package components 200 may be formed to compensate for design or process variations in the package components 150 (e.g., the connector structures 130 of the package components). Examples of design variations include increasing solder regions 128 for some of the connector structures 130. More specifically, connector structures 130 located along a perimeter of the package component 150 may utilize larger solder regions 128 to improve bonding of the package components 150/200. In addition, dummy connector structures 130 (e.g., electrically isolated from the integrated circuitry of the package components 150/200) may utilize larger solder regions 128 to improve bonding without risk of shorting if the resulting merged solder regions 328 spread out toward adjacent dummy components.

In some embodiments, the connector structures 130 may have a variance that ranges from about 1 μm to about 3 μm. To account for this variance the thickness T5 of the base layer 224B and the thickness T7 of the capping layer 224D are selected to determine a relative placement of the intermediate layer 224C. Note that the thickness T6 to the intermediate layer 224C may remain constant.

For example, some of the base layers 224B may be formed with a low thickness T5 while the corresponding capping layers 224D are formed with a high thickness T7. In addition, others of the base layers 224B may be formed with a high thickness T5 while the corresponding capping layers 224D are formed with a low thickness T7. As a result, the placement of the respective intermediate layers 224C may vary by about 1 μm to about 3 μm.

As illustrated, due to the above-described tuning, the merged solder regions 328 may make physical contact with the intermediate layers 224C regardless of the variations in the connector structures 130 of the package component 150. As such, the intermediate layers 224C may achieve the above-described benefits, and the bonded connector structures 330 may result in analogous compositions and dimensions as described above in such similar embodiments.

Figure 19:
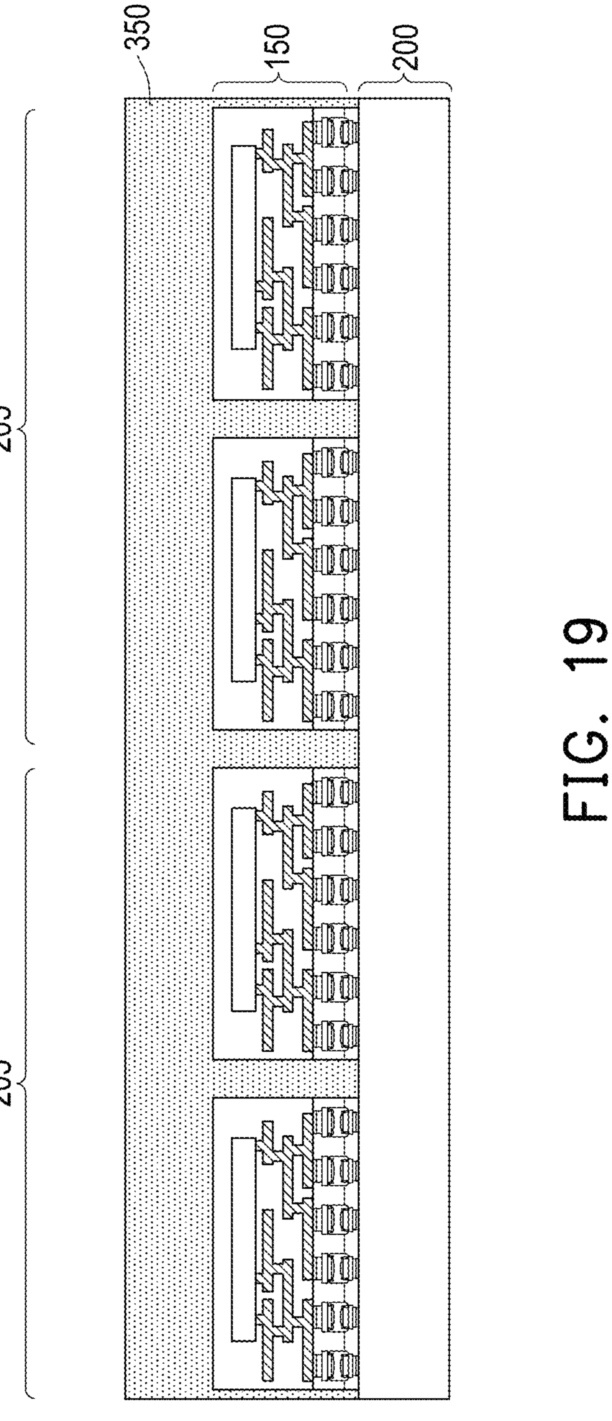
FIGS. 19-21 illustrate intermediate stages in processing a semiconductor package, in accordance with some embodiments.

FIG. 19 illustrates multiple package components 150 attached to the package component 200 using a thermocompression bonding (TCB) process and baking process to attach the package components 150 to the package component 200. It should be appreciated that the multiple package components 150 may have different configurations and functions, i.e., may be different package types, in some embodiments, while in other embodiments, each of the multiple package components 150 may be the same type.

Following attaching the package components 150 to the package component 200, an encapsulant 350 may be deposited over and between the package components 150. The encapsulant 350 may be a molding compound, a dielectric material, a polyimide, a polymer, and so forth, or combinations thereof. The encapsulant 350 may be deposited by any suitable process, such as by spin-on, CVD, flowable CVD, lamination, compression, and so forth.

Figure 20:
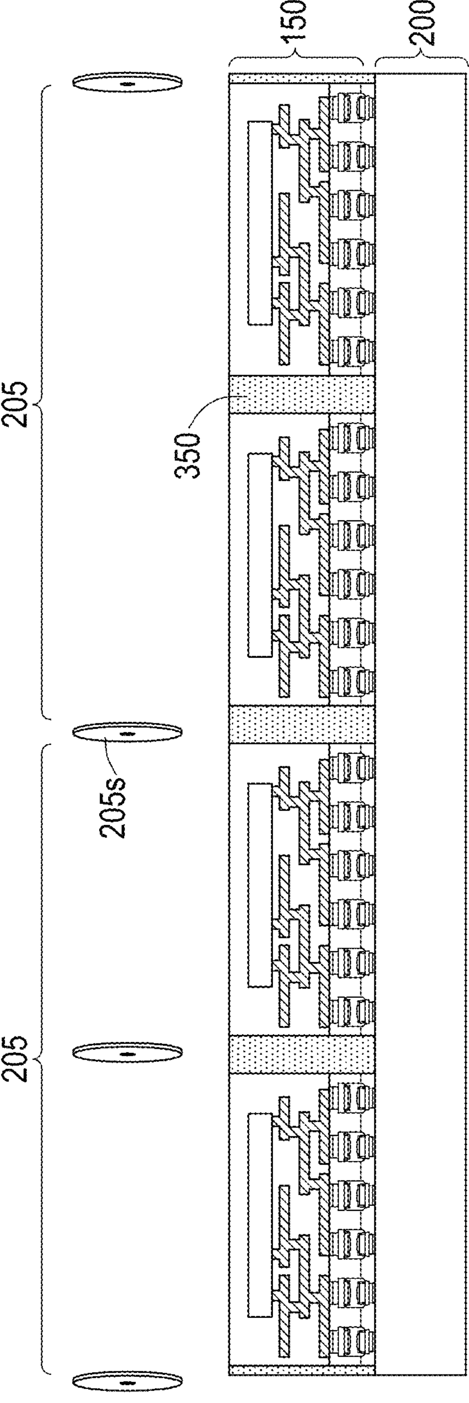

In FIG. 20, the encapsulant 350 may be planarized, such as by a chemical mechanical planarization (CMP) process so that the upper surfaces of the package components 150 and the upper surface of the encapsulant 350 are leveled to each other. In some embodiments, the planarization may be continued to thin the package components 150.

In some embodiments, the combination of the package components 150 and package component 200 may be singulated using a singulation process 205*s* so that package regions 205 are separated from each other. The singulation process 205*s* may include a die-saw process, an etching process, a laser cutting process, the like, or combinations thereof. The singulation process 205*s* is performed along scribe lines between the package regions 205. Package regions 205 are thus separated from each other to form discrete package components 300 (see FIG. 21).

Figure 21:
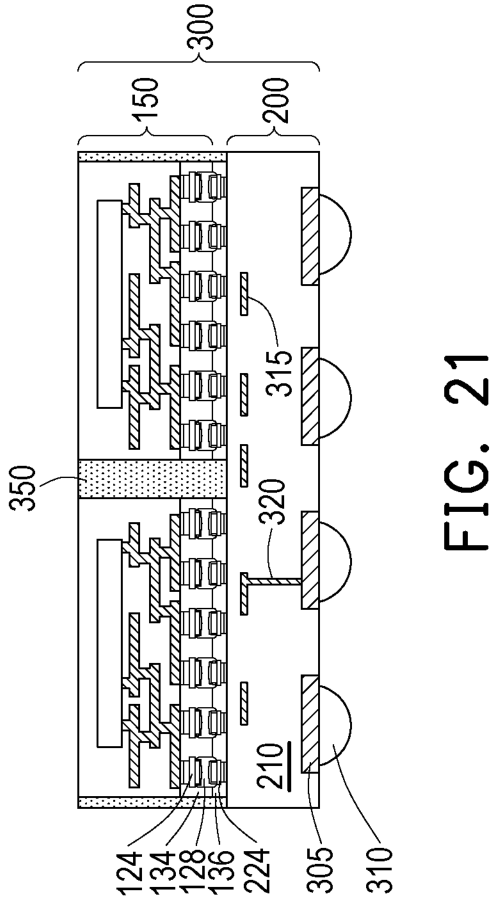

FIG. 21 illustrates the singulated discrete package components 300. Following the singulation, the discrete package components 300 can be used in another package or in another device structure. In some embodiment, such as those illustrated, before or after singulation, the conductive connectors 310 may be formed on a side of the substrate 210 opposite the package components 150. Forming the conductive connectors 310 may include forming contact pads 305 at the surface of the substrate 210, the contact pads 305 electrically coupled to the metal pillars 224, for example by an interconnect 315 and through vias 320 of the package component 200. The conductive connectors 310 can be formed on the contact pads 305. In some embodiments, the conductive connectors 310 may include optional under bump metallurgies (UBMs) extending through a passivation layer disposed on the substrate 210. The UBMs may be formed of the same material as the contact pads 305. The conductive connectors 310 may include ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 310 may include a conductive material such as solder, copper, aluminum, gold, nickel, silver, palladium, tin, the like, or a combination thereof. The conductive connectors 310 may be formed by sputtering, printing, electro plating, electroless plating, CVD, or the like. In some embodiments, the conductive connectors 310 include a metal pillar and a metal cap layer formed on the top of the metal pillar. The metal cap layer may include nickel, tin, tin-lead, gold, silver, palladium, indium, nickel-palladium-gold, nickel-gold, the like, or a combination thereof and may be formed by a plating process.

Figure 22A:
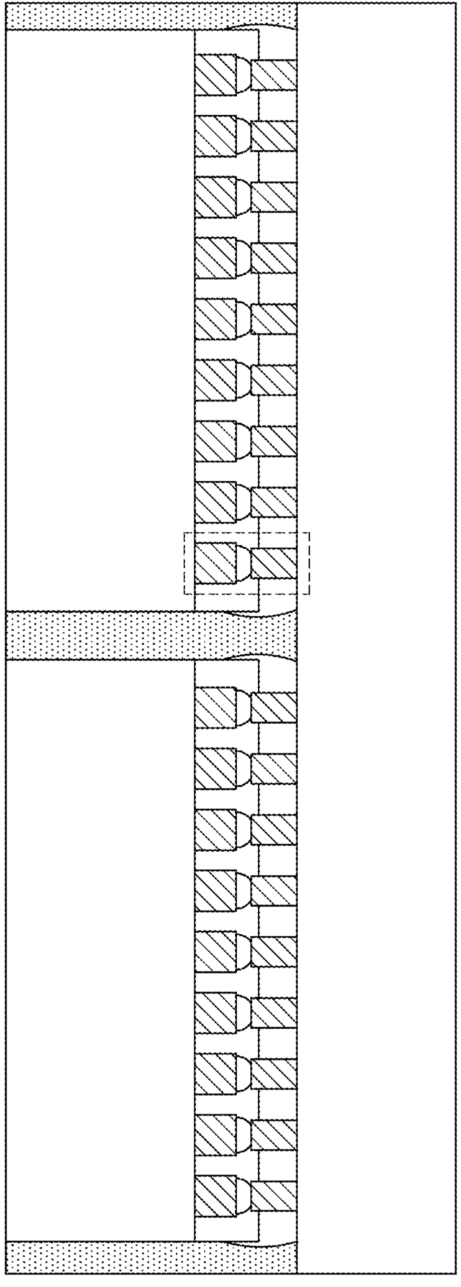
FIGS. 22A-22C illustrate processed semiconductor packages, in accordance with some embodiments.
Figure 22B:
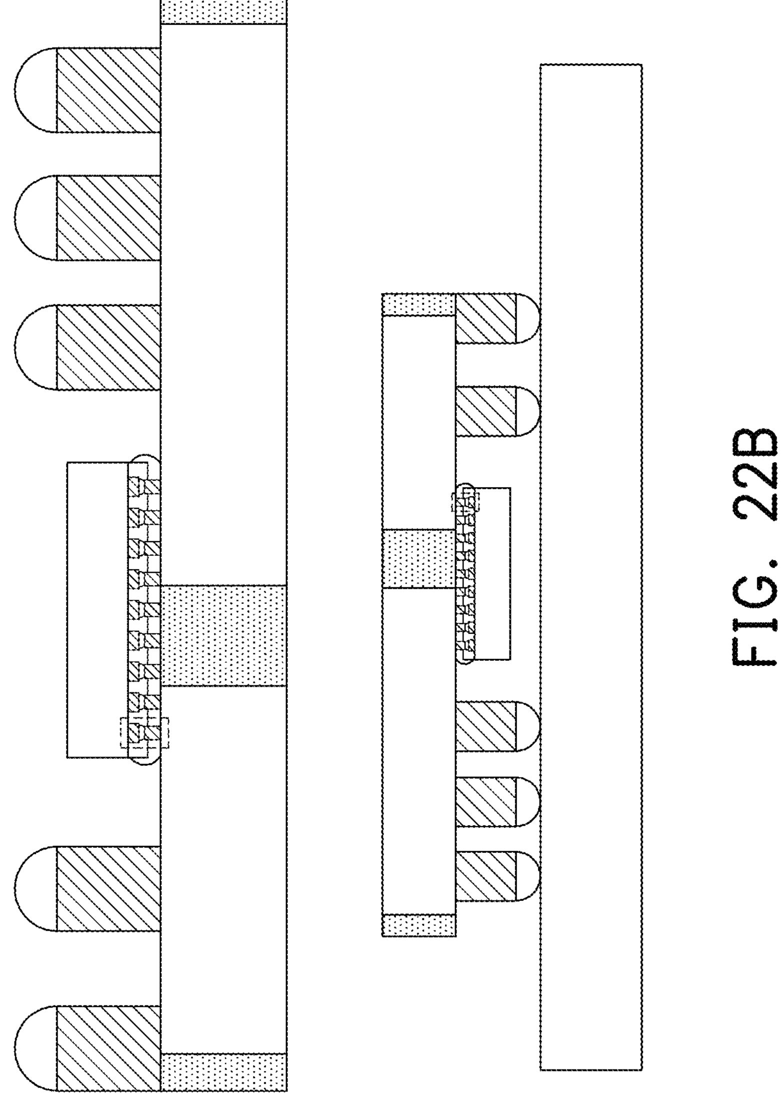
Figure 22C:
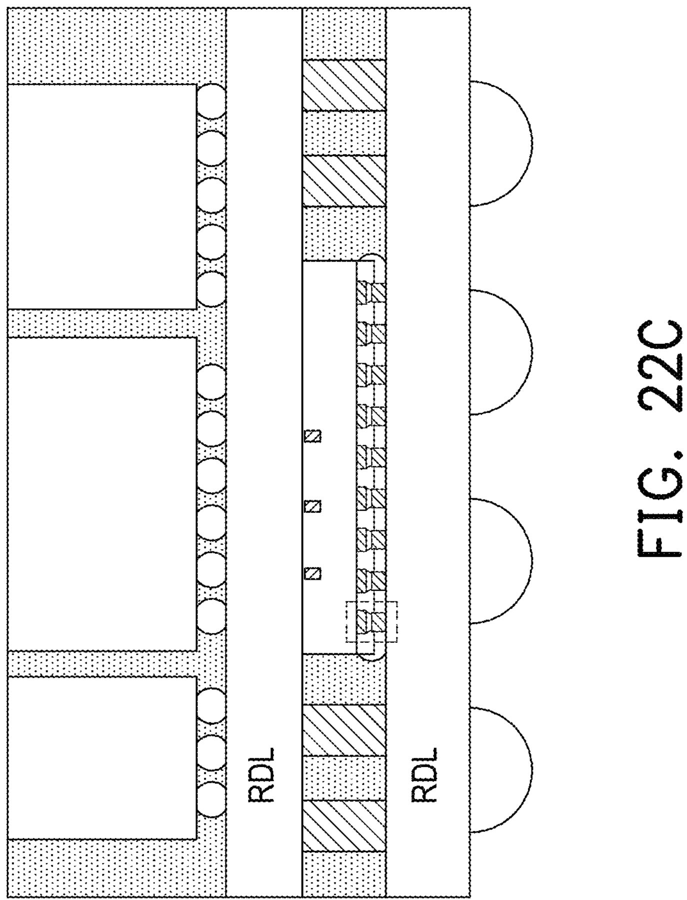

FIGS. 22A-22C illustrate exemplary semiconductor packages that may utilize some of the above embodiments of connector structures 130/230/330. Referring to FIG. 22A, any of the above embodiments may be utilized in a chip-on-wafer (CoW) semiconductor package to attach an integrated circuit chip (e.g., the package component 150) to an interposer (e.g., the package component 200). Referring to FIG. 22B, any of the above embodiments may be utilized to attach a bridge die (e.g., the package component 150) to two or more integrated circuit dies (e.g., collectively, the package component 200). Referring to FIG. 22C, any of the above embodiments may be utilized to attach an integrated circuit die (e.g., the package component 150) to a first redistribution structure (e.g., the package component 200), and a second redistribution structure may be formed over and electrically connected to a back side of the integrated circuit die. Additional integrated circuit dies may then be attached thereto. It should be appreciated that a semiconductor package may include one or more of these exemplary package types as well as one or more embodiments of the connector structures 130/230/330 described in this disclosure.

Embodiments advantageously provide improved bonding between package components 150/200 during formation of semiconductor packages. In particular, the metal pillars 124/224 of connector structures 130/230 along each of the package components 150/200 are designed to improve the reliability of the merged solder regions 328. After undergoing stress testing, storage, and/or functional use, the connections remain robust and voidless.

In an embodiment, a method includes forming a device region along a first substrate; forming an interconnect structure over the device region and the first substrate; forming a metal pillar over the interconnect structure, forming the metal pillar comprising: forming a base layer over the interconnect structure; forming an intermediate layer over the base layer; and forming a capping layer over the intermediate layer; forming a solder region over the capping layer; and performing an etch process to recess sidewalls of the base layer and the capping layer from sidewalls of the intermediate layer and the solder region. In another embodiment, the base layer is a first copper layer, and wherein the capping layer is a second copper layer. In another embodiment, the intermediate layer is a nickel layer. In another embodiment, after performing the etch process: the base layer comprises a first width; the intermediate layer comprises a second width; the capping layer comprises the first width; and the solder region comprises the second width. In another embodiment, the solder region comprises a lead free solder material. In another embodiment, the method further includes bonding the solder region to a connector structure of a package component, wherein after bonding the solder region to the connector structure a merged solder region physically contacts the intermediate layer, wherein the merged solder region results from the solder region reflowing with an additional solder region of the connector structure. In another embodiment, the connector structure comprises: an additional base layer; an additional intermediate layer over the additional base layer, wherein after bonding the solder region to the connector structure the merged solder region physically contacts the additional intermediate layer; an additional capping layer over the additional intermediate layer; and the additional solder region over the additional capping layer. In another embodiment, wherein before bonding the solder region to the connector structure: the additional base layer comprises a third width; the additional intermediate layer comprises a fourth width; the additional capping layer comprises the third width; and the additional solder region comprises the fourth width.

In an embodiment, a method of forming a semiconductor package includes forming a first integrated circuit over a first substrate; forming a patterned plating mask over the first integrated circuit, the patterned plating mask comprising openings; forming first connector structures, forming the first connector structures comprising: forming base layers in corresponding ones of the openings; forming intermediate layers over corresponding ones of the base layers, the intermediate layers comprising nickel; forming capping layers over corresponding ones of the intermediate layers, the capping layers being free of nickel; and forming first solder regions over corresponding ones of the capping layers, the first solder regions being free of nickel; removing the patterned plating mask; performing an etch process using an etchant selective to material of the base layers and the capping layers; depositing a polymer material over and between the first connector structures; planarizing the polymer material to be level with upper surfaces of the first solder regions; and depositing a non-conductive film over the polymer material. In another embodiment, the method further includes forming second connector structures over a second substrate, the second connector structures comprising metal pillars and second solder regions; bonding the first connector structures to the second connector structures, wherein the first solder regions bond with respective second solder regions to form merged solder regions. In another embodiment, the merged solder regions are in physical contact with the intermediate layers. In another embodiment, the method further includes, after bonding the first connector structures to the second connector structures, performing cycle testing on the semiconductor package, wherein after performing the cycle testing the merged solder regions comprise nickel. In another embodiment, the intermediate layers further comprise iron-cobalt. In another embodiment, the method further includes, before forming the patterned plating mask, forming a seed layer over the first integrated circuit, wherein performing the etch process comprises removing exposed portions of the seed layer.

In an embodiment, a semiconductor device includes a first interconnect structure over a first substrate; a first metal pillar over the first interconnect structure, the first metal pillar comprising: a first base layer over the first interconnect structure, the first base layer having a first lateral width; a first intermediate layer over the first base layer, the first intermediate layer having a second lateral width, the second lateral width being greater than the first lateral width; and a first capping layer over the first intermediate layer, the first capping layer having the first lateral width; a solder region over and around sidewalls of the first capping layer; a second metal pillar over the solder region, the second metal pillar comprising: a second capping layer, the solder region being around sidewalls of the second capping layer, the second capping layer having a third lateral width; a second intermediate layer over the second capping layer, the second intermediate layer having a fourth lateral width, the fourth lateral width being greater than the third lateral width; and a second base layer over the second intermediate layer, the second base layer having the third lateral width; and a second interconnect structure over the second metal pillar. In another embodiment, the first intermediate layer comprises a first nickel layer, wherein the second intermediate layer comprises a second nickel layer. In another embodiment, the first nickel layer physically contacts the first base layer and the first capping layer, and wherein the second intermediate layer further comprises an iron-cobalt layer. In another embodiment, the solder region comprises a first intermetallic compound layer along the first capping layer and a second intermetallic compound layer along the second capping layer. In another embodiment, the second intermetallic compound layer comprises nickel. In another embodiment, the first intermetallic compound layer is free of nickel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a device region along a first substrate;

forming an interconnect structure over the device region and the first substrate;

forming a metal pillar over the interconnect structure, forming the metal pillar comprising:

forming a base layer over the interconnect structure;

forming an intermediate layer over the base layer; and forming a capping layer over the intermediate layer;

forming a solder region over the capping layer; and performing an etch process to recess sidewalls of the base layer and the capping layer from sidewalls of the intermediate layer and the solder region.

2. The method of claim 1, wherein the base layer is a first copper layer, and wherein the capping layer is a second copper layer.

3. The method of claim 2, wherein the intermediate layer is a nickel layer.

4. The method of claim 1, wherein after performing the etch process:

the base layer comprises a first width;

the intermediate layer comprises a second width;

the capping layer comprises the first width; and the solder region comprises the second width.

5. The method of claim 1, wherein the solder region comprises a lead free solder material.

6. The method of claim 1, further comprising bonding the solder region to a connector structure of a package component, wherein after bonding the solder region to the connector structure a merged solder region physically contacts the intermediate layer, wherein the merged solder region results from the solder region reflowing with an additional solder region of the connector structure.

7. The method of claim 6, wherein the connector structure comprises:

an additional base layer;

an additional intermediate layer over the additional base layer, wherein after bonding the solder region to the connector structure the merged solder region physically contacts the additional intermediate layer;

an additional capping layer over the additional intermediate layer; and the additional solder region over the additional capping layer.

8. The method of claim 7, wherein before bonding the solder region to the connector structure:

the additional base layer comprises a third width;

the additional intermediate layer comprises a fourth width;

the additional capping layer comprises the third width; and the additional solder region comprises the fourth width.

9. A method of forming a semiconductor package, the method comprising:

forming a first integrated circuit over a first substrate;

forming a patterned plating mask over the first integrated circuit, the patterned plating mask comprising openings;

forming first connector structures, forming the first connector structures comprising:

forming base layers in corresponding ones of the openings;

forming intermediate layers over corresponding ones of the base layers, the intermediate layers comprising nickel;

forming capping layers over corresponding ones of the intermediate layers, the capping layers being free of nickel; and forming first solder regions over corresponding ones of the capping layers, the first solder regions being free of nickel;

removing the patterned plating mask;

performing an etch process using an etchant selective to a material of the base layers and the capping layers;

depositing a polymer material over and between the first connector structures;

planarizing the polymer material to be level with upper surfaces of the first solder regions; and depositing a non-conductive film over the polymer material.

10. The method of claim 9, further comprising:

forming second connector structures over a second substrate, the second connector structures comprising metal pillars and second solder regions;

bonding the first connector structures to the second connector structures, wherein the first solder regions bond with respective second solder regions to form merged solder regions.

11. The method of claim 10, wherein the merged solder regions are in physical contact with the intermediate layers.

12. The method of claim 11, further comprising, after bonding the first connector structures to the second connector structures, performing cycle testing on the semiconductor package, wherein after performing the cycle testing the merged solder regions comprise nickel.

13. The method of claim 9, wherein the intermediate layers further comprise iron-cobalt.

14. The method of claim 9, further comprising, before forming the patterned plating mask, forming a seed layer over the first integrated circuit, wherein performing the etch process comprises removing exposed portions of the seed layer.

15. A semiconductor device comprising:

a first interconnect structure over a first substrate;

a first metal pillar over the first interconnect structure, the first metal pillar comprising:

a first base layer over the first interconnect structure, the first base layer having a first lateral width;

a first intermediate layer over the first base layer, the first intermediate layer having a second lateral width, the second lateral width being greater than the first lateral width; and a first capping layer over the first intermediate layer, the first capping layer having the first lateral width;

a solder region over and around sidewalls of the first capping layer;

a second metal pillar over the solder region, the second metal pillar comprising:

a second capping layer, the solder region being around sidewalls of the second capping layer, the second capping layer having a third lateral width;

a second intermediate layer over the second capping layer, the second intermediate layer having a fourth lateral width, the fourth lateral width being greater than the third lateral width; and a second base layer over the second intermediate layer, the second base layer having the third lateral width; and a second interconnect structure over the second metal pillar.

16. The semiconductor device of claim 15, wherein the first intermediate layer comprises a first nickel layer, wherein the second intermediate layer comprises a second nickel layer.

17. The semiconductor device of claim 16, wherein the first nickel layer physically contacts the first base layer and the first capping layer, and wherein the second intermediate layer further comprises an iron-cobalt layer.

18. The semiconductor device of claim 15, wherein the solder region comprises a first intermetallic compound layer along the first capping layer and a second intermetallic compound layer along the second capping layer.

19. The semiconductor device of claim 18, wherein the second intermetallic compound layer comprises nickel.

20. The semiconductor device of claim 19, wherein the first intermetallic compound layer is free of nickel.

* * * * *